(12) United States Patent
Nakata

(10) Patent No.: US 12,744,520 B2
(45) Date of Patent: Sep. 22, 2026

(54) SEMICONDUCTOR INTEGRATED CIRCUIT AND MEMORY SYSTEM

(71) Applicant: Kioxia Corporation, Tokyo (JP)

(72) Inventor: Masashi Nakata, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 87 days.

(21) Appl. No.: 18/981,100

(22) Filed: Dec. 13, 2024

(65) Prior Publication Data

US 2026/0066885 A1 Mar. 5, 2026

(30) Foreign Application Priority Data

Aug. 28, 2024 (JP) ................................ 2024-146570

(51) Int. Cl.

*H03K 5/131* (2014.01)
*G11C 7/22* (2006.01)
*H03K 3/037* (2006.01)
*H03K 5/135* (2006.01)

(52) U.S. Cl.

CPC ............ *H03K 5/131* (2013.01); *G11C 7/222* (2013.01); *H03K 3/037* (2013.01); *H03K 5/135* (2013.01)

(58) Field of Classification Search

CPC ........ G11C 7/222; H03K 5/135; H03K 3/037; H03K 5/131

See application file for complete search history.

(56) References Cited

U.S. PATENT DOCUMENTS 3,097,339 A * 7/1963 McAuliffe ............ H03K 5/065 327/100
5,896,045 A * 4/1999 Siegel ........... H03K 19/018521 326/68
6,084,452 A 7/2000 Drost
6,084,453 A * 7/2000 Fuse ..................... H03K 5/133 327/284
9,831,867 B1 * 11/2017 Kinzer .......... H03K 19/017509
12,416,649 B1 * 9/2025 Makovsky .......... G01R 15/146
2005/0116756 A1 * 6/2005 Kim .................... H03K 5/1534 327/218
2008/0074151 A1 * 3/2008 Kim .................... H03K 19/096 327/144

(Continued)

FOREIGN PATENT DOCUMENTS

CN 110060714 A * 7/2019 .......... G11C 7/1045

*Primary Examiner* — Menatoallah Youssef
*Assistant Examiner* — Khareem E Almo
(74) *Attorney, Agent, or Firm* — Foley & Lardner LLP

(57) ABSTRACT

According to one embodiment, semiconductor integrated circuit includes: first and second pulse generators that generate first and second pulse signals based on a first signal, and third and fourth pulse signal based on a second signal, respectively; first and second inversion buffers that output a third signal based on inputs of the first and third pulse signals, and a fourth signal based on inputs of the second and fourth pulse signal, respectively; wherein, when a logic level of the first or the third pulse signal changes from a first logic level to a second logic level, the first inversion buffer changes a logic level of the third signal, and when a logic level of the second or the fourth pulse signal changes from the first logic level to the second logic level, the second inversion buffer changes a logic level of the fourth signal.

20 Claims, 14 Drawing Sheets

(56) References Cited

U.S. PATENT DOCUMENTS

| | | | | |
|---|---|---|---|---|
| 2010/0302872 | A1* | 12/2010 | Lee | G11C 11/4076 365/194 |
| 2012/0075279 | A1* | 3/2012 | Ishida | H03K 19/018521 327/108 |
| 2014/0056082 | A1* | 2/2014 | Park | G11C 29/04 365/189.07 |
| 2015/0318855 | A1* | 11/2015 | Song | H03K 19/017509 327/309 |
| 2017/0077915 | A1 | 3/2017 | Nakata | |
| 2022/0085812 | A1* | 3/2022 | Singh | H03K 19/018521 |
| 2023/0216489 | A1 | 7/2023 | Narawade | |
| 2026/0066885 | A1* | 3/2026 | Nakata | H03K 5/131 |

* cited by examiner

DCA
1
7
6a
6b
CLKT
CLKB
DELAY
DELAY
CLKIN_T
CLKOUT
CLA
CLKOUTB
CLKIN_B
CLKT_IO
CLKB_IO
DCA_CODE

CLKT
CLKB
Delay
CLKIN_T
CLKIN_B
CLKT_IO
CLKB_IO

FIG. 4

CLKT
CLKB
CLKIN_T
Delay
CLKIN_B
CLKT_IO
CLKB_IO

FIG. 5

| IN | FB | Q |
|---|---|---|
| 0 | 0 | 0 |
| 0 | 1 | 1 |
| 1 | 0 | 0 |
| 1 | 1 | (Hold state) |

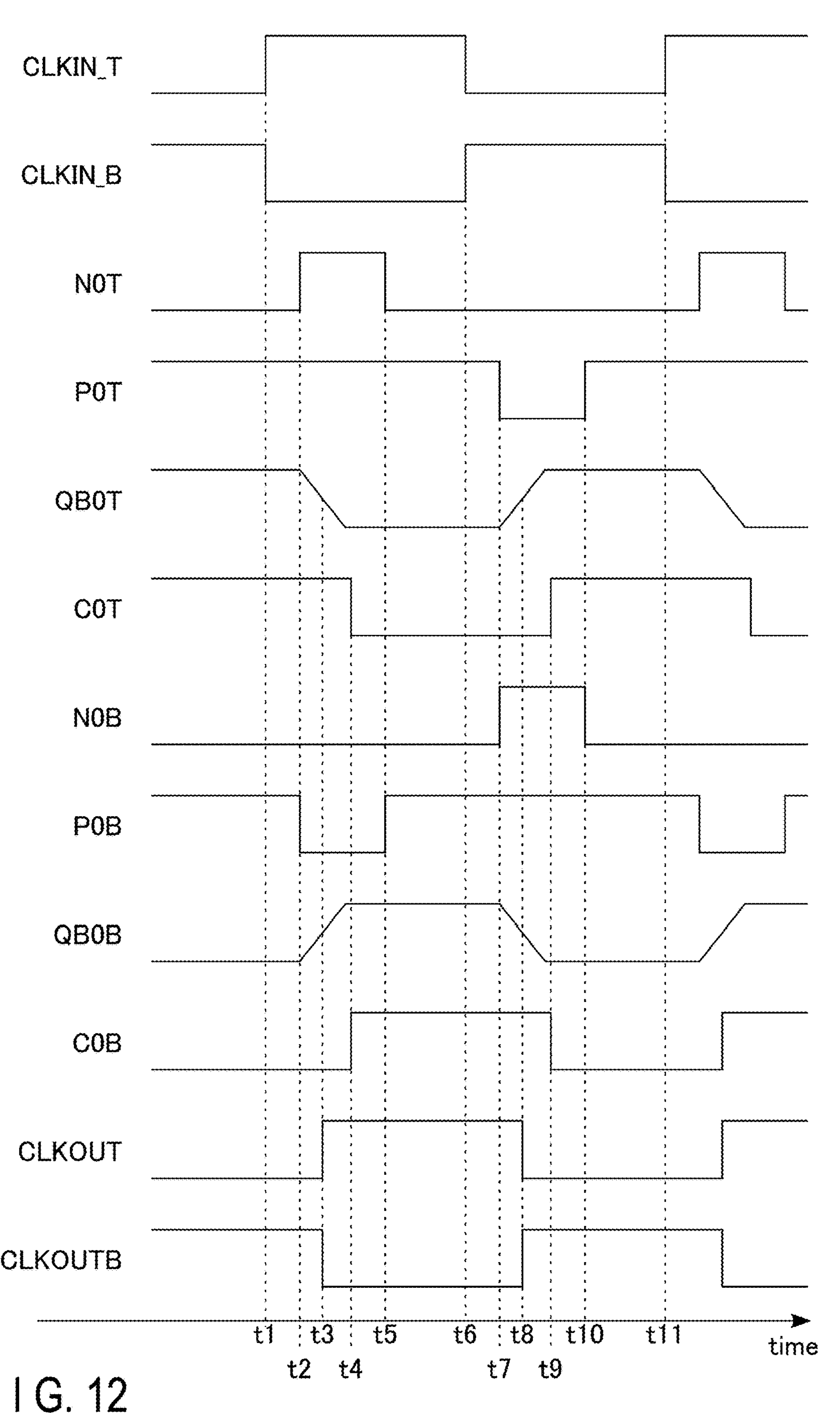
F I G. 12

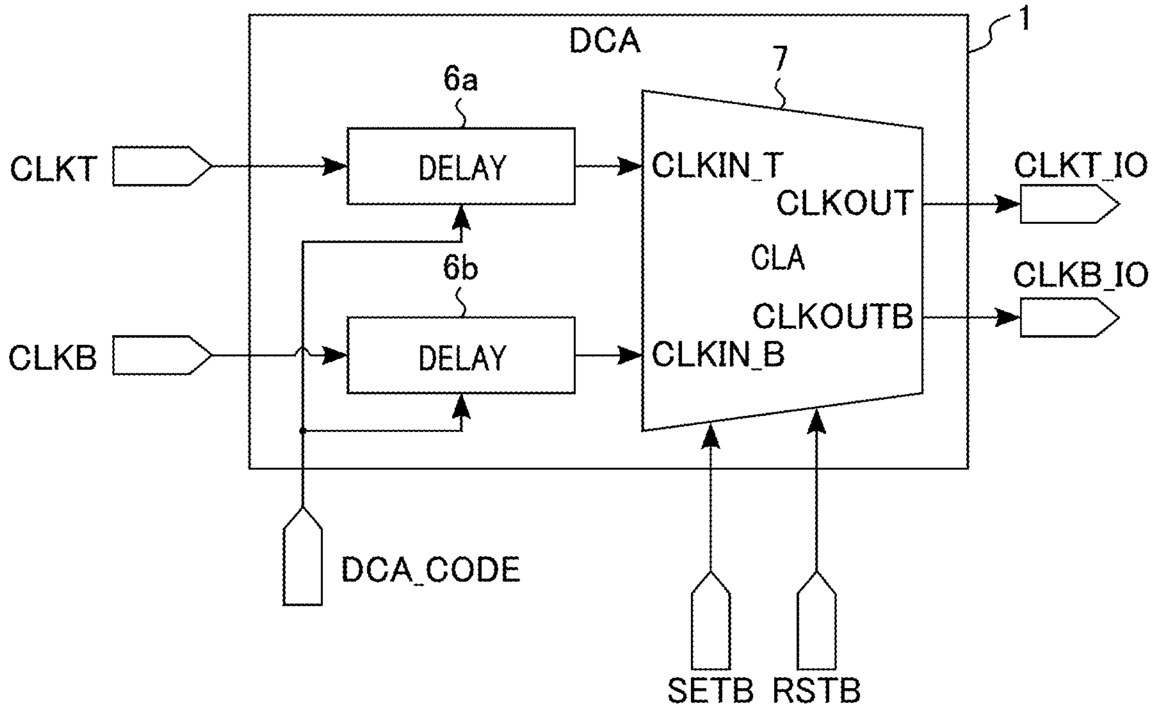
F I G. 13

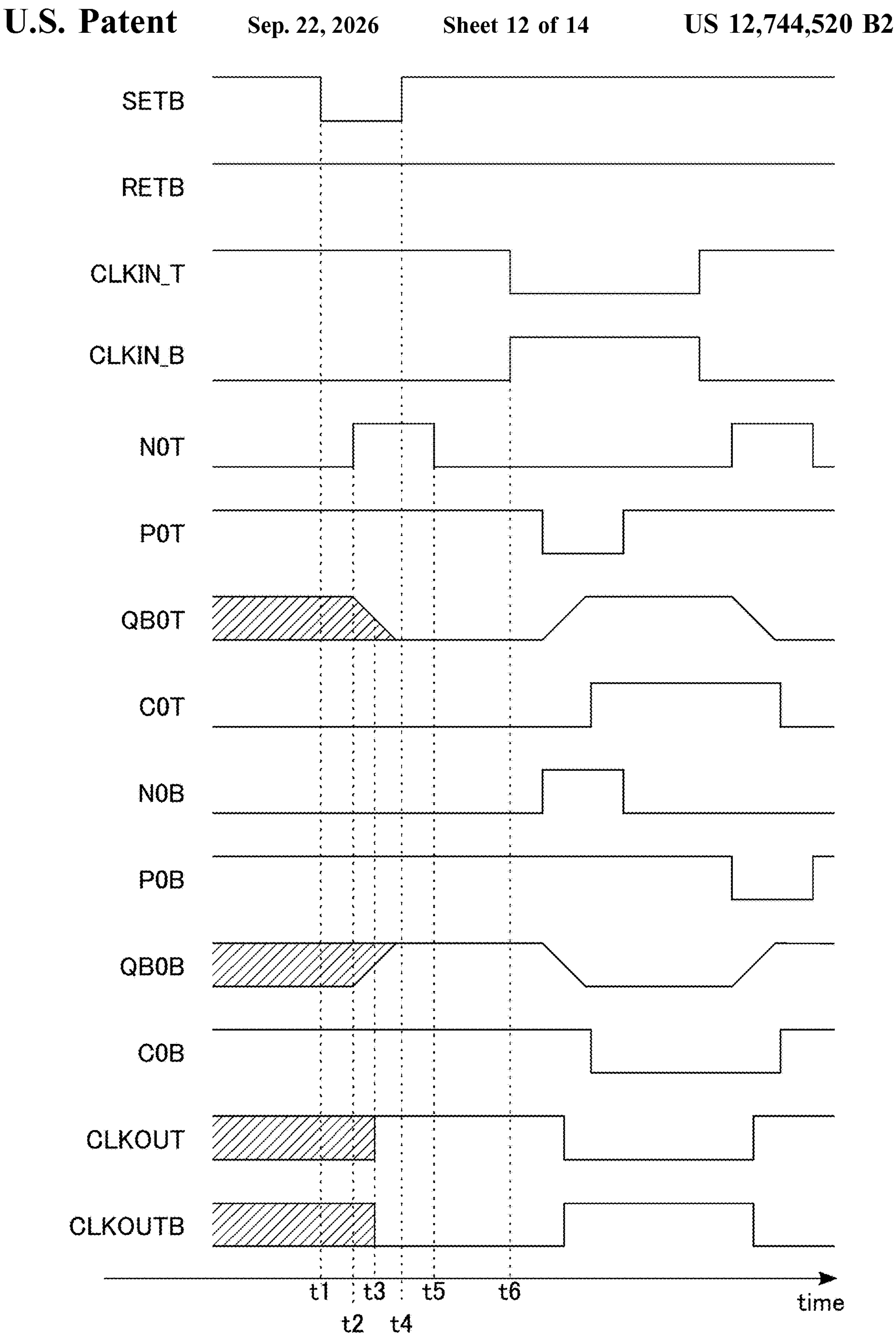
F I G. 15

F I G. 16

SEMICONDUCTOR INTEGRATED CIRCUIT AND MEMORY SYSTEM

CROSS-REFERENCE TO RELATED APPLICATIONS

This application is based upon and claims the benefit of priority from Japanese Patent Application No. 2024-146570, filed Aug. 28, 2024, the entire contents of which are incorporated herein by reference.

FIELD

Embodiments described herein relate generally to a semiconductor integrated circuit and a memory system.

BACKGROUND

In a memory system that performs high-speed communication using a toggle double data rate (DDR) or the like, a duty cycle correction (DCC) circuit is used to correct duty ratio between clock signals. The DCC circuit includes a duty cycle detector (DCD) circuit that detects the magnitude of a duty error, and a duty cycle adjuster (DCA) circuit that adjusts the duty cycles, based on the detected magnitude of the duty error.

BRIEF DESCRIPTION OF THE DRAWINGS

FIG. 4 is a timing chart illustrating an example operation of the DCA circuit according to the first embodiment.

FIG. 5 is a timing chart illustrating an example operation of the DCA circuit according to the first embodiment.

FIG. 12 is a timing chart illustrating an example operation of the clock adjustment circuit according to the third embodiment.

FIG. 13 is a block diagram illustrating an example configuration of a DCA circuit according to a fourth embodiment.

FIG. 15 is a timing chart illustrating an example operation of the clock adjustment circuit according to the fourth embodiment.

FIG. 16 is a timing chart illustrating an example operation of the clock adjustment circuit according to the fourth embodiment.

DETAILED DESCRIPTION

Figure 1:
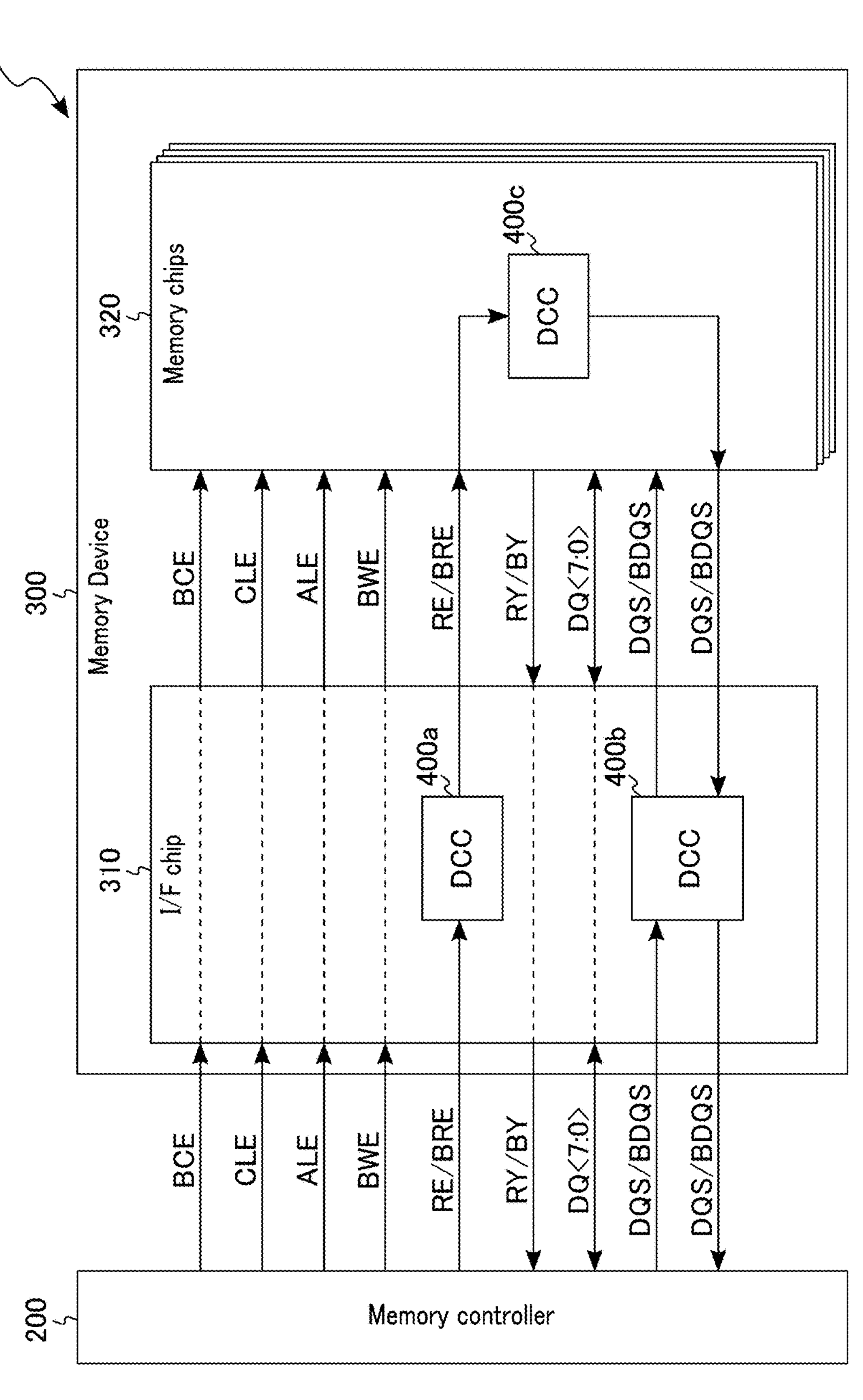
FIG. 1 is a block diagram illustrating an example configuration of a memory system according to a first embodiment.

In general, according to one embodiment, a semiconductor integrated circuit and a memory system include: a first pulse generator that generates a first pulse signal based on a first signal, and a second pulse signal that is an inverted signal of the first pulse signal; a second pulse generator that generates a third pulse signal based on a second signal, and a fourth pulse signal that is an inverted signal of the third pulse signal; a first inversion buffer that outputs a third signal from a first node, based on inputs of the first pulse signal and the third pulse signal; and a second inversion buffer that outputs a fourth signal from a second node, based on inputs of the second pulse signal and the fourth pulse signal, wherein, when a logic level of the first pulse signal changes from a first logic level to a second logic level different from the first logic level, the first inversion buffer changes a logic level of the third signal from the second logic level to the first logic level, and, when a logic level of the third pulse signal changes from the second logic level to the first logic level, the first inversion buffer changes the logic level of the third signal from the first logic level to the second logic level, and, when a logic level of the second pulse signal changes from the second logic level to the first logic level, the second inversion buffer changes a logic level of the fourth signal from the first logic level to the second logic level, and, when a logic level of the fourth pulse signal changes from the first logic level to the second logic level, the second inversion buffer changes the logic level of the fourth signal from the second logic level to the first logic level.

In the description below, embodiments will be described with reference to the drawings. The drawings are schematic, and dimensions and ratios in the drawings are not necessarily the same as actual ones. In the description below, components having substantially the same functions and configurations are denoted by the same reference numerals. In a case where elements having similar configurations are specifically distinguished from each other, different characters or numbers may be added to the end of the same reference numeral.

In the description below, a first element "being coupled" to a second element includes the first element being coupled indirectly to the second element via an intermediate element that is always or selectively conductive, or being coupled directly to the second element without any intermediate element.

In the description below, a rectangular signal is a signal that alternately supplies voltages corresponding to logic levels "0" and "1" in constant cycles. It is assumed that the voltage corresponding to the logic level "1" is higher than the voltage corresponding to the logic level "0". A change in the logic level of a rectangular signal from "0" to "1" is said "a signal rises", and a change from "1" to "0" is said "a signal falls". The period from when a rectangular signal rises once to when the rectangular signal falls is referred to as the positive pulse width of the signal. The period from when a rectangular signal falls once to when the rectangular signal rises is referred to as the negative pulse width of the signal.

In the description below, among rectangular signals, a rectangular signal in which the positive pulse width and the negative pulse width are set to approximately the same length (the duty cycle being approximately 50%) is referred to particularly as a clock signal. Among the rectangular signals, a signal having a large difference between the positive pulse width and the negative pulse width (the duty cycle greatly deviating from 50%) is referred to particularly as a pulse signal. Among pulse signals, a pulse signal having a positive pulse width sufficiently smaller than a negative pulse width is referred to particularly as a positive pulse signal. A pulse signal having a negative pulse width sufficiently smaller than a positive pulse width is referred to particularly as a negative pulse signal.

1. First Embodiment

1.1 Configuration of a Memory System

A memory system according to a first embodiment is now described. FIG. 1 is a block diagram illustrating an example configuration of a memory system according to the first embodiment. A memory system 100 is a storage device designed to be coupled to an external host device (not illustrated). The memory system 100 is a memory card such as an SD™ card, a universal flash storage (UFS), or a solid-state drive (SSD). The memory system 100 includes a memory controller 200 and a memory device 300.

The memory controller 200 is formed with an integrated circuit such as a system on a chip (SoC). The memory controller 200 controls the memory device 300, based on a request from an external host device. Specifically, the memory controller 200 writes data requested to be written by the external host device, into a nonvolatile memory included in the memory device 300. The memory controller 200 also reads the data requested to be read by the external host device from the nonvolatile memory included in the memory device 300, and outputs the data to the external host device. For example, the respective signals of a chip enable signal BCE, a command latch enable signal CLE, an address latch enable signal ALE, a write enable signal BWE, read enable signals RE and BRE, an input/output signal DQ<7:0>, a ready/busy signal RY/BY, and data strobe signals DQS and BDQS are transmitted and received between the memory controller 200 and the memory device 300. The prefix "B" indicates the inverted logic of a signal having a name without the prefix "B". The read enable signal BRE is an inverted signal of the read enable signal RE, and the two signals are a differential clock signal pair. The data strobe signal BDQS is an inverted signal of the data strobe signal DQS, and the two signals are a differential clock signal pair.

The chip enable signal BCE puts the memory device 300 into an enabled state. The command latch enable signal CLE notifies the memory device 300 of command transmission by the input/output signal DQ<7:0>. The address latch enable signal ALE notifies the memory device 300 of address information transmission by the input/output signal DQ<7:0>. The write enable signal BWE instructs the memory device 300 to write the input/output signal DQ<7:0>. The read enable signals RE and BRE instruct the memory device 300 to output the input/output signal DQ<7:0>. The ready/busy signal RY/BY indicates whether the memory device 300 that transmits the signal is in a ready state (a state of receiving an instruction from the outside), or in a busy state (a state of not receiving any instruction from the outside). The input/output signal DQ<7:0> has an 8-bit width, and includes a command, write data or read data, address information, and a status, for example. The data strobe signals DQS and BDQS notify the memory controller 200 and the memory device 300 of the input/output timing of the input/output signal DQ<7:0>.

The memory device 300 includes an interface chip 310 and a plurality of memory chips 320. The memory chips 320 are coupled in parallel to the interface chip 310.

The interface chip 310 interfaces, between the memory controller 200 and the plurality of memory chips 320, the respective signals of the chip enable signal BCE, the command latch enable signal CLE, the address latch enable signal ALE, the write enable signal BWE, the read enable signals RE and BRE, the ready/busy signal RY/BY, the input/output signal DQ<7:0>, and the data strobe signals DQS and BDQS. For example, the interface chip 310 has a configuration to transmit various signals only to one of the memory chips 320 to be operated, by transmitting the chip enable signal BCE to the one memory chip to be operated among the memory chips 320 and putting the one memory chip 320 into an enabled state.

The interface chip 310 has a function of transferring a signal input from the memory controller 200 to the target memory chip 320 by a toggle double data rate (DDR) method, for example. As the toggle DDR method is used, the input/output rate of signals in each memory chip 320 is increased, and high-speed communication of signals can be possible.

Each of the memory chips 320 is a NAND flash memory, for example. Each memory chip 320 includes a memory cell array including a plurality of memory cells. Each memory chip 320 stores data in a nonvolatile manner.

The interface chip 310 and the memory chips 320 each include one or more duty cycle correction (DCC) circuits 400. The DCC circuit 400 has a function of adjusting the duty cycle of an input clock signal to be approximately 50% and outputting the corrected clock signal. Specifically, the interface chip 310 includes DCC circuits **400*a* and 400*b*. Each memory chip 320 includes a DCC circuit 400*c*. In the description below, the index indicating how much the duty cycle deviates from 50% in the clock signal will be referred to as a "duty error". By the DCC circuit 400 corrects duty ratio, a duty error is reduced. The DCC circuit 400*a* corrects a difference in duty cycle between the read enable signals RE and BRE, that are output from the memory controller 200 and are input to the memory chips 320. The DCC circuit 400*b* corrects duty ratio between the data strobe signals DQS and BDQS, that are output from the memory controller 200 and are input to the memory chips 320, and between the data strobe signals DQS and BDQS, that are output from the memory chips 320 and are input to the memory controller 200. The DCC circuit 400*c* corrects duty ratio between the read enable signals RE and BRE that are output from the interface chip 310, and converts the read enable signals RE and BRE into the data strobe signals DQS and BDQS. The DCC circuits 400*a*, 400*b*, and 400*c*** have substantially the same configurations.

1.2 Configuration of a DCC Circuit

Figures 2, 3:
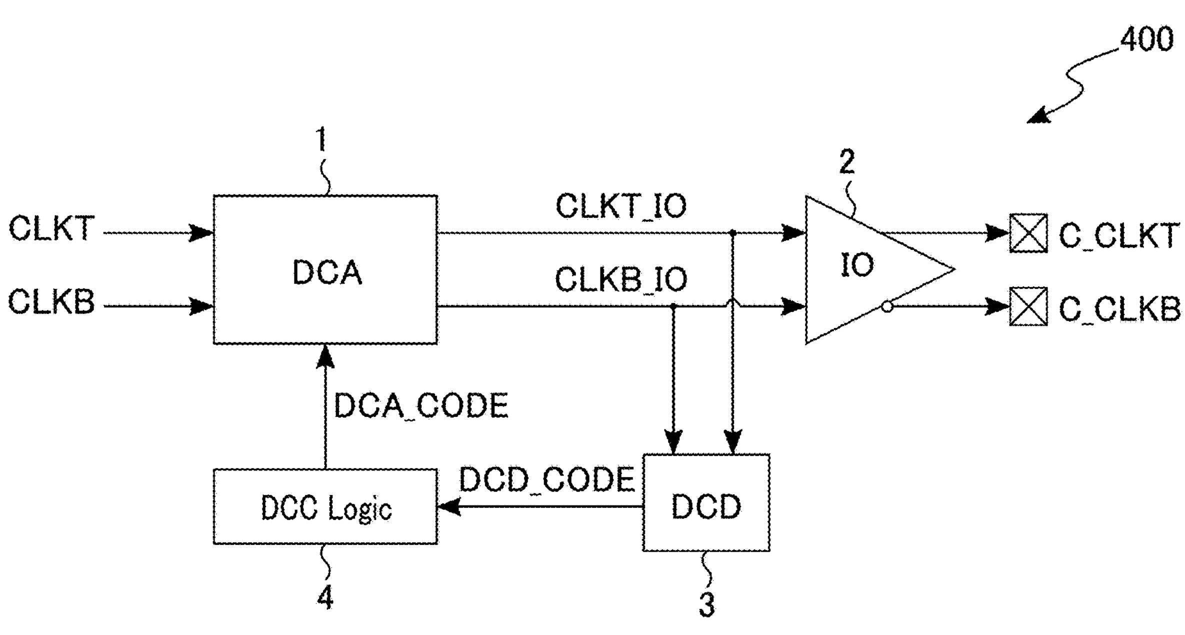
FIG. 2 is a block diagram illustrating an example configuration of a DCC circuit according to the first embodiment.
FIG. 3 is a block diagram illustrating an example configuration of a DCA circuit according to the first embodiment.

A DCC circuit according to the first embodiment is now described. FIG. 2 is a block diagram illustrating an example configuration of a DCC circuit according to the first embodiment. For example, a DCC circuit 400 receives an input of differential clock signals CLKT and CLKB, corrects duty ratio between the clock signals CLKT and CLKB, and outputs the corrected clock signals as differential corrected clock signals C_CLKT and C_CLKB. In the memory system 100, the clock signals CLKT and CLKB, and the corrected clock signals C_CLKT and C_CLKB correspond to the read enable signals RE and BRE, or the data strobe signals DQS and BDQS.

As illustrated in FIG. 2, the DCC circuit 400 includes a duty cycle adjuster (DCA) circuit 1, an input/output (IO) buffer 2, a duty cycle detector (DCD) circuit 3, and a DCC logic circuit 4. The DCC circuit 400 can perform feedback control to reduce the duty error by detecting the duty error of the clock signals CLKT_IO and CLKB_IO output from the DCA circuit 1 with the DCD circuit 3, and performing adjustment with the DCA circuit 1 based on the detected duty error.

The input differential clock signals CLKT and CLKB, and a control signal DCA_CODE described later are input to the DCA circuit 1. The DCA circuit 1 adjusts the duty cycle of the differential corrected clock signals C_CLKT and C_CLKB to approximately 50%, based on the control signal DCA_CODE. The DCA circuit 1 outputs differential clock signals CLKT_IO and CLKB_IO subjected to the duty cycle adjustment.

The input/output buffer 2 receives the clock signals CLKT_IO and CLKB_IO output from the DCA circuit 1, performs control such as amplification, and outputs the corrected clock signals C_CLKT and C_CLKB.

The DCD circuit 3 measures the positive pulse widths of the clock signals CLKT_IO and CLKB_IO output from the DCA circuit 1, and detects the duty error of the clock signals. The DCD circuit 3 outputs a signal DCD_CODE indicating the positive pulse widths of the respective clock signals CLKT_IO and CLKB_IO. The signal DCD_CODE has a plurality of bits (32 bits, for example).

The DCC logic circuit 4 determines a delay setting value of the clock signal, based on the signal DCD_CODE output from the DCD circuit 3. Specifically, the DCC logic circuit 4 compares the positive pulse width of the clock signal CLKT_IO with the positive pulse width of the clock signal CLKB_IO, and outputs the control signal DCA_CODE for reducing the duty error, based on the comparison result.

1.3 DCA Circuit 1.3.1 Configuration

Next, the DCA circuit according to the first embodiment is described. FIG. 3 is a block diagram illustrating an example configuration of the DCA circuit according to the first embodiment. As illustrated in FIG. 3, the DCA circuit 1 includes two delay adjustment circuits (DELAYs) 6*a* and 6*b* and a clock adjustment circuit (CLA) 7.

The delay adjustment circuit 6*a* receives a clock signal CLKT and the control signal DCA_CODE as inputs, delays the clock signal CLKT based on the control signal DCA_CODE, and outputs the delayed clock signal CLKT as a clock signal CLKIN_T. The delay adjustment circuit 6*b* receives a clock signal CLKB and the control signal DCA_CODE as inputs, delays the clock signal CLKB based on the control signal DCA_CODE, and outputs the delayed clock signal CLKB as a clock signal CLKIN_B. The two delay adjustment circuits 6*a* and 6*b* have substantially the same configurations.

The clock adjustment circuit 7 receives the delayed clock signals CLKIN_T and CLKIN_B as inputs. The clock adjustment circuit 7 generates and outputs differential clock signals CLKOUT and CLKOUTB having the duty cycle adjusted based on the phase difference between the clock signals CLKIN_T and CLKIN_B. The clock signals CLKOUT and CLKOUTB turn directly into the clock signals CLKT_IO and CLKB_IO, which are outputs of the DCA circuit 1.

1.3.2 Operation

Figures 4, 5:
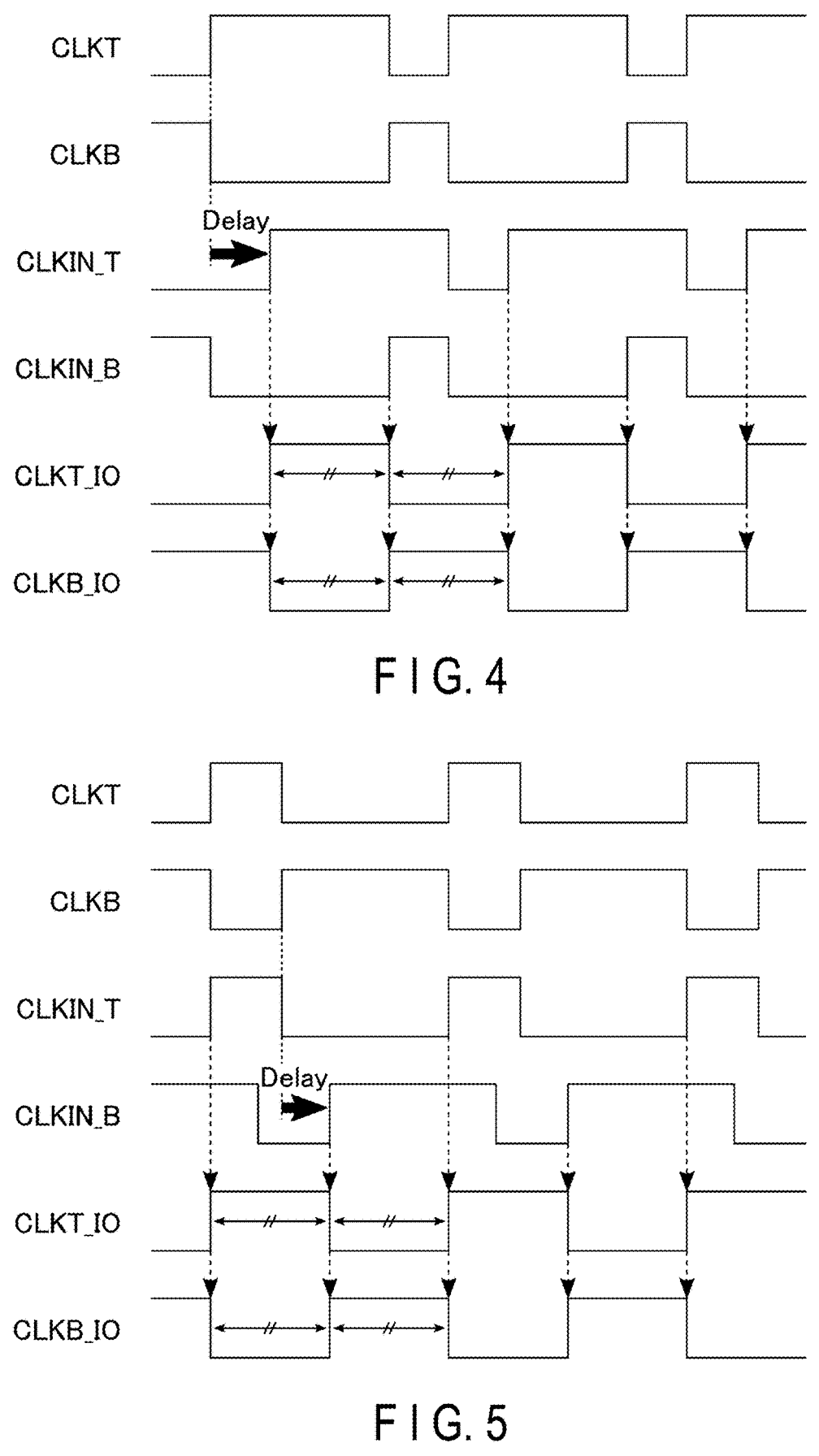

FIGS. 4 and 5 are timing charts illustrating an example operation of the DCA circuit according to the first embodiment. FIG. 4 illustrates an example operation to be performed by the DCA circuit 1 in a case where the positive pulse width of the input clock signal CLKT is greater than the positive pulse width of the clock signal CLKB. FIG. 5 illustrates an example operation to be performed by the DCA circuit 1 in a case where the positive pulse width of the input clock signal CLKT is smaller than the positive pulse width of the clock signal CLKB.

As illustrated in FIG. 4, in a case where the positive pulse width of the clock signal CLKT is greater, the DCA circuit 1 drives the delay adjustment circuit 6*a*, delays the clock signal CLKT, and generates the clock signal CLKIN_T. On the other hand, the clock signal CLKB is output as the clock signal CLKIN_B without any change. The clock adjustment circuit 7 causes a clock signal CLKOUT (which is the clock signal CLKT_IO) to rise, and causes a clock signal CLKOUTB (which is the clock signal CLKB_IO) to fall, in response to a rise of the input clock signal CLKIN_T. The clock adjustment circuit 7 causes the clock signal CLKOUT to fall, and causes the clock signal CLKOUTB to rise, in response to a rise of the input clock signal CLKIN_B. Accordingly, the timing of the rise of the clock signal CLKOUT is delayed from the timing of the rise of the clock signal CLKT, but the timing of the fall of the clock signal CLKOUT does not change. Thus, the positive pulse width of the clock signal CLKOUT can be adjusted to be smaller. Likewise, the timing of the fall of the clock signal CLKOUTB is delayed from the timing of the fall of the clock signal CLKB, but the timing of the rise of the clock signal CLKOUTB does not change. Thus, the positive pulse width of the clock signal CLKOUTB can be adjusted to be greater. In this manner, the DCA circuit 1 adjusts the duty cycle to be approximately 50%, and generates the differential clock signals CLKT_IO and CLKB_IO.

As illustrated in FIG. 5, in a case where the positive pulse width of the clock signal CLKT is smaller, the DCA circuit 1 drives the delay adjustment circuit 6*b*, delays the clock signal CLKB, and generates the clock signal CLKIN_B. On the other hand, the clock signal CLKT is output as the clock signal CLKIN_T without any change. The clock adjustment circuit 7 causes the clock signal CLKOUT to rise, and causes the clock signal CLKOUTB to fall, in response to a rise of the input clock signal CLKIN_T. The clock adjustment circuit 7 causes the clock signal CLKOUT to fall, and causes the clock signal CLKOUTB to rise, in response to a rise of the input clock signal CLKIN_B. Accordingly, the timing of the fall of the clock signal CLKOUT is delayed from the timing of the fall of the clock signal CLKT, but the timing of the rise of the clock signal CLKOUT does not change. Thus, the positive pulse width of the clock signal CLKOUT can be adjusted to be greater. Likewise, the timing of the rise of the clock signal CLKOUTB is delayed from the timing of the rise of the original clock signal CLKB, but the timing of the fall of the clock signal CLKOUTB does not change. Thus, the positive pulse width of the clock signal CLKOUTB can be adjusted to be smaller. In this manner, the DCA circuit 1 adjusts the duty cycle to be approximately 50%, and generates the differential clock signals CLKT_IO and CLKB_IO.

Note that, in the above example and the example described below, the clock adjustment circuit 7 changes the logic levels of the clock signals CLKOUT and CLKOUTB to be output, in response to rises of the input clock signals CLKIN_T and CLKIN_B. However, the present embodiment is not limited to this. For example, the clock adjustment circuit 7 may change the logic levels of the clock signals CLKOUT and CLKOUTB to be output, in response to falls of the input clock signals CLKIN_T and CLKIN_B. In this case, the clock signal CLKB is delayed in a case where the positive pulse width of the clock signal CLKT is greater, and the clock signal CLKT is delayed in a case where the positive pulse width of the clock signal CLKT is smaller.

1.4 Clock Adjustment Circuit 1.4.1 Configuration

Figure 6:
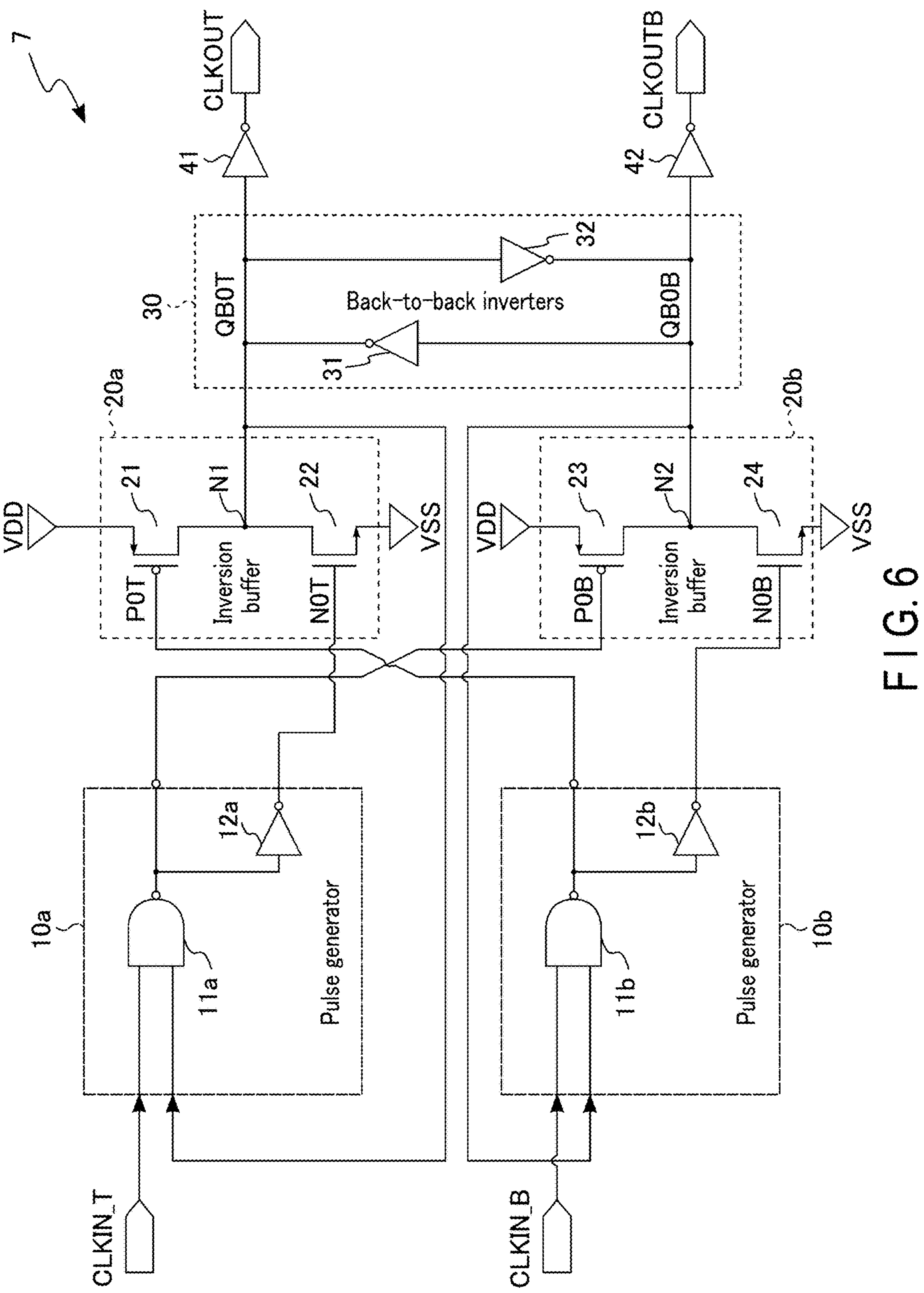
FIG. 6 is a circuit diagram illustrating an example circuit configuration of a clock adjustment circuit according to the first embodiment.

FIG. 6 is a circuit diagram illustrating an example configuration of the clock adjustment circuit according to the first embodiment. As illustrated in FIG. 6, the clock adjustment circuit 7 includes two pulse generators 10*a* and 10*b*, two inversion buffers 20*a* and 20*b*, back-to-back inverters 30, and inverters 41 and 42.

The pulse generators 10*a* and 10*b* output two pulse signals having opposite phases from an input clock signal and an input feedback signal. The pulse generator 10*a* includes a negative AND (NAND) circuit 11*a* and an inverter 12*a*. The pulse generator 10*b* includes a NAND circuit 11*b* and an inverter 12*b*. The pulse generators 10*a* and 10*b* have substantially the same configurations.

The NAND circuits 11*a* and 11*b* are logic circuits that perform NAND-operations. The NAND circuits 11*a* and 11*b* each have first and second input terminals and an output terminal.

The inverters 12*a* and 12*b* are logic circuits that perform NOT-operations. The inverters 12*a* and 12*b* each have an input terminal and an output terminal.

The clock signal CLKIN_T is input to a first input terminal of the NAND circuit 11*a*, and a signal QB0T to be described later is input as a feedback signal to a second input terminal. The NAND circuit 11*a* performs a NAND logical operation, and outputs a pulse signal POB. The pulse signal POB is a negative pulse signal. The inverter 12*a* receives the pulse signal POB as an input, and outputs a pulse signal NOT. The pulse signal NOT is a positive pulse signal.

The clock signal CLKIN_B is input to the first input terminal of the NAND circuit 11*b*, and a signal QB0B to be described later is input as a feedback signal to the second input terminal. The NAND circuit 11*b* performs a NAND logical operation, and outputs a pulse signal POT. The pulse signal POT is a negative pulse signal. The inverter 12*b* receives the pulse signal POT as an input, and outputs a pulse signal NOB. The pulse signal NOB is a positive pulse signal.

The pulse signals NOT, POT, NOB, and POB are signals for controlling the transistors included in the inversion buffers 20*a* and 20*b*. Hereinafter, the voltage at the logic level corresponding to "0" will be also referred to as the "L" level, and the voltage at the logic level corresponding to "1" will be also referred to as the "H" level.

The inversion buffers 20*a* and 20*b* are circuits that output signals based on the input pulse signals. The inversion buffer 20*a* outputs the signal QB0T based on the pulse signals NOT and POT. The inversion buffer 20*a* includes transistors 21 and 22. The inversion buffer 20*b* outputs the signal QB0B based on the pulse signals NOB and POB. The inversion buffer 20*b* includes transistors 23 and 24.

The transistors 21, 22, 23, and 24 are metal oxide semiconductor field effect transistors (MOSFETs). The transistors 21 and 23 are P-type MOSFETs, for example. The transistors 21 and 23 conduct the drain terminal and the source terminal to each other in a case where the voltage applied to the gate terminal is at the "L" level, and insulate the drain terminal and the source terminal from each other in a case where the voltage applied to the gate terminal is at the "H" level. The threshold voltages of the transistors 21 and 23 are substantially equal. The transistors 22 and 24 are N-type MOSFETs, for example. The transistors 22 and 24 conduct the drain terminal and the source terminal to each other in a case where the voltage applied to the gate terminal is at the "H" level, and insulate the drain terminal and the source terminal from each other in a case where the voltage applied to the gate terminal is at the "L" level. The threshold voltages of the transistors 22 and 24 are substantially equal.

In the inversion buffer 20*a*, the drain terminal of the transistor 21 and the drain terminal of the transistor 22 are coupled via a node N1. The source terminal of the transistor 21 is coupled to a power supply potential VDD. The source terminal of the transistor 22 is coupled to a ground potential VSS. The pulse signal POT is input to the gate terminal of the transistor 21. The pulse signal NOT is input to the gate terminal of the transistor 22. As the transistors 21 and 22 are controlled by the pulse signals POT and NOT, the inversion buffer 20*a* varies the voltage of the node N1, and generates the signal QB0T. The signal QB0T is input as a feedback signal to the pulse generator 10*a* (to be more specific, the NAND circuit 11*a*).

In the inversion buffer 20*b*, the drain terminal of the transistor 23 and the drain terminal of the transistor 24 are coupled via a node N2. The source terminal of the transistor 23 is coupled to the power supply potential VDD. The source terminal of the transistor 24 is coupled to the ground potential VSS. The pulse signal POB is input to the gate terminal of the transistor 23. The pulse signal NOB is input to the gate terminal of the transistor 24. As the transistors 23 and 24 are controlled by the pulse signals POB and NOB, the inversion buffer 20*b* varies the voltage of the node N2, and generates the signal QB0B. The signal QB0B is input as a feedback signal to the pulse generator 10*b* (to be more specific, the NAND circuit 11*b*).

The back-to-back inverters 30 are provided to couple the nodes N1 and N2. The back-to-back inverters 30 include inverters 31 and 32. The inverters 31 and 32 are logic circuits that perform NOT-operations. The inverter 31 has an input terminal coupled to the node N2, and an output terminal coupled to the node N1. The inverter 32 has an input terminal coupled to the node N1, and an output terminal coupled to the node N2. That is, the inverters 31 and 32 couple the nodes N1 and N2 in parallel. The inverters 31 and 32 invert and output the logic levels input to the input terminals. The threshold voltages of the inverters 31 and 32 are substantially equal.

The magnitudes of the currents to be output from the inverters 31 and 32 included in the back-to-back inverters 30 are set to be smaller than the magnitudes of the currents to be output from the inversion buffers 20*a* and 20*b*. For example, in a case where the inverters 31 and 32 include a plurality of transistors (MOSFETs), the size of the transistors included in the inverters 31 and 32 are smaller than the size of the transistors 21, 22, 23, and 24 constituting the inversion buffers 20*a* and 20*b*. With this arrangement, in a case where the logic level of the output of the inversion buffer 20*a* differs from the logic level of the output of the inverter 31, the logic level of the output of the inversion buffer 20*a* is prioritized as the logic level of the node N1. In a case where the logic level of the output of the inversion buffer 20*b* differs from the logic level of the output of the inverter 32, the logic level of the output of the inversion buffer 20*b* is prioritized as the logic level of the node N2.

The inverters 41 and 42 are logic circuits that perform NOT-operations. The inverter 41 receives the signal QB0T as an input, shapes the waveform into a substantially rectangular shape, inverts the logic level, and outputs the resultant signal as the clock signal CLKOUT. The inverter 42 receives the signal QB0B as an input, shapes the waveform into a substantially rectangular shape, inverts the logic level, and outputs the resultant signal as the clock signal CLKOUTB. The clock signals CLKOUT and CLKOUTB are a differential signal pair. The threshold voltages of the inverters 41 and 42 are substantially equal.

1.4.2 Operation

Figure 7:
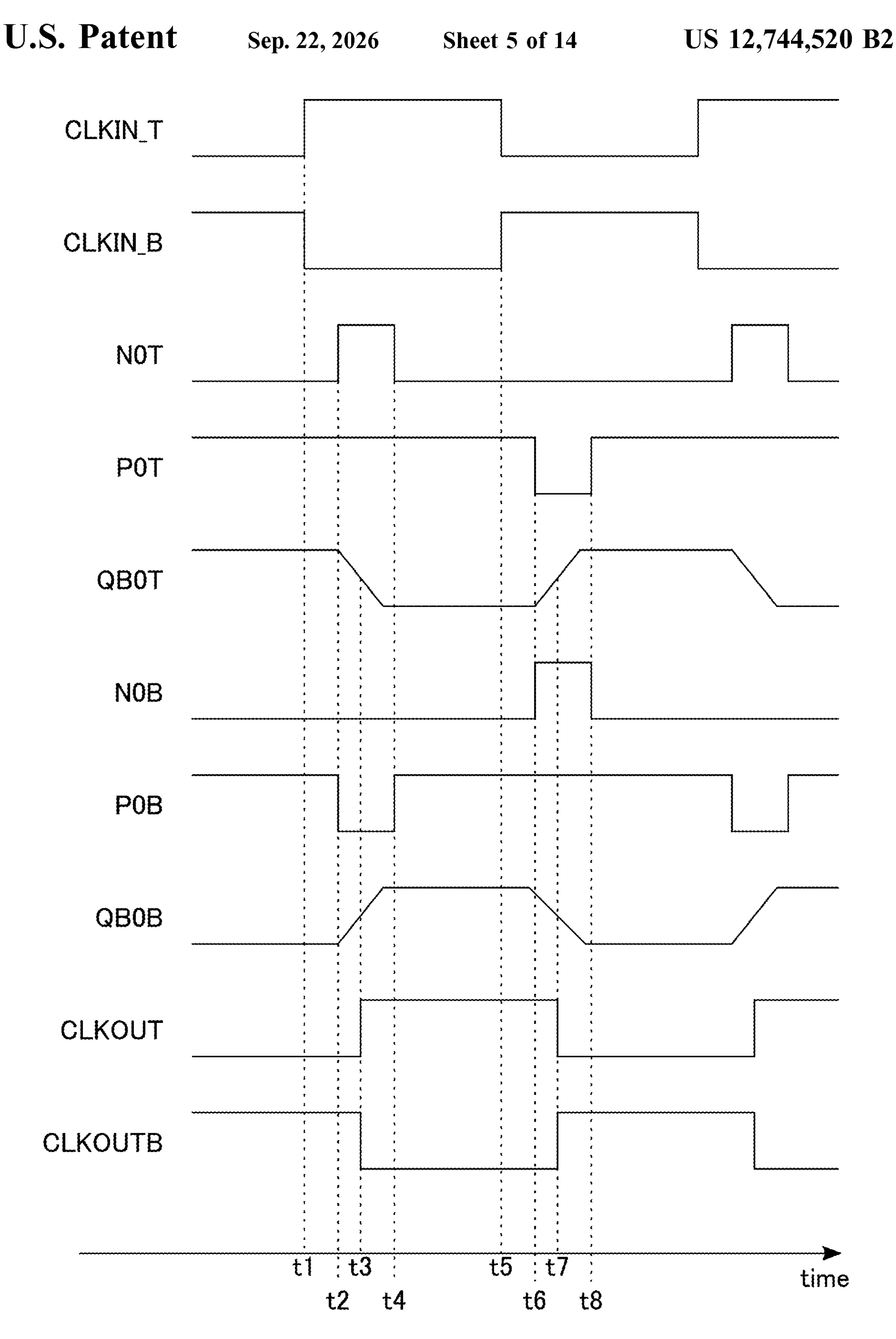
FIG. 7 is a timing chart illustrating an example operation of the clock adjustment circuit according to the first embodiment.

FIG. 7 is a timing chart illustrating an example operation of the clock adjustment circuit according to the first embodiment. In the description below, an operation of the clock adjustment circuit 7 is explained with reference to FIG. 7.

The clock signals CLKIN_T and CLKIN_B are input to the clock adjustment circuit 7. In the example illustrated in FIG. 7, the clock signal CLKIN_T rises at time t1, and the clock signal CLKIN_B rises at time t5. Note that the example illustrated in FIG. 7 indicates a case where any delay of the clock signals CLKIN_T and CLKIN_B by the delay adjustment circuits 6*a* and 6*b* has not occurred. As long as the times at which the respective clock signals CLKIN_T and CLKIN_B fall are not included in the periods during which the transistors 21, 22, 23, and 24 are driven, delays of the clock signals CLKIN_T and CLKIN_B for adjusting the duty cycle by the delay adjustment circuits 6*a* and 6*b* may have occurred.

When the clock signal CLKIN_T rises at time t1, a delay by the NAND circuit 11*a* occurs, and the pulse signal NOT rises at time t2. As a result, the transistor 22 is driven, and the voltage of the node N1 gradually falls. Accordingly, the signal QB0T gradually falls. Further, the pulse signal POB falls at time t2. As a result, the transistor 23 is driven, and the voltage of the node N2 gradually rises. Accordingly, the signal QB0B gradually rises.

When the voltage of the signal QB0T reaches the threshold voltage of the inverter 41 at time t3, the clock signal CLKOUT rises. Further, when the voltage of the signal QB0B reaches the threshold voltage of the inverter 42, the clock signal CLKOUTB falls. The back-to-back inverters 30 adjust the rise of the clock signal CLKOUT and the fall of the clock signal CLKOUTB so as to occur at the same time.

Further, when the voltage of the signal QB0T reaches the threshold voltage of the NAND circuit 11*a* at time t3, the output of the NAND circuit 11*a* changes. As a result, after the delay by the NAND circuit 11*a*, the pulse signal NOT falls, and the pulse signal POB rises at time t4.

When the clock signal CLKIN_B rises at time t5, a delay by the NAND circuit 11*b* occurs, and the pulse signal NOB rises at time t6. As a result, the transistor 24 is driven, and the voltage of the node N2 gradually falls. Accordingly, the signal QB0B gradually falls. Further, the pulse signal POT falls at time t6. As a result, the transistor 21 is driven, and the voltage of the node N1 gradually rises. Accordingly, the signal QB0T gradually rises.

When the voltage of the signal QB0T reaches the threshold voltage of the inverter 41 at time t7, the clock signal CLKOUT falls. Further, when the voltage of the signal QB0B reaches the threshold voltage of the inverter 42, the clock signal CLKOUTB rises. The back-to-back inverters 30 adjust the fall of the clock signal CLKOUT and the rise of the clock signal CLKOUTB so as to occur at the same time.

Further, when the voltage of the signal QB0T reaches the threshold voltage of the NAND circuit 11*b* at time t7, the output of the NAND circuit 11*b* changes. As a result, after the delay by the NAND circuit 11*b*, the pulse signal NOB falls, and the pulse signal POT rises at time t8.

The positive pulse widths of the pulse signals NOT and NOB are set to be longer than the response times of the output signals in response to the input signals of the inversion buffers 20*a* and 20*b*, and to be smaller than the positive pulse widths of the clock signals CLKOUT and CLKOUTB to be output. Specifically, the pulse signal NOT rises once and falls once during the period from a rise of the clock signal CLKIN_T to a rise of the clock signal CLKIN_B. The pulse signal NOB rises once and falls once during the period from a rise of the clock signal CLKIN_B to a rise of the clock signal CLKIN_T. Further, since the pulse signals POT and POB are signals obtained by inverting the pulse signals NOB and NOT, respectively, the negative pulse widths of the respective signals are equal to the positive pulse widths of the pulse signals NOB and NOT.

The back-to-back inverters 30 have a role of matching the voltage transition speed at the node N1 with the voltage transition speed at the node N2. For example, in a case where the transition speed before the output voltage of the inversion buffer 20*a* rises is lower than the transition speed before the output voltage of the inversion buffer 20*b* falls between time t2 and time t3, the voltage at the "H" level is applied to the node N1 via the inverter 31. As a result, the transition speed at which the voltage of the node N1 rises can be increased. Further, in a case where the transition speed before the output voltage of the inversion buffer 20*b* falls is lower than the transition speed before the output voltage of the inversion buffer 20*a* rises between time t2 and time t3, the voltage at the "L" level is applied to the node N2 via the inverter 32. As a result, the transition speed at which the voltage of the node N2 falls can be increased. In the same manner, the transition speed of the voltage at each of the nodes N1 and N2 between time t6 and time t7 can be adjusted. As described above, the voltage transition speed between the nodes N1 and N2 is equalized.

1.5 Effects

The DCA circuit according to the first embodiment can reduce the duty error of clock signals to be output. This effect is now described in detail.

The DCA circuit 1 according to the first embodiment includes the two inversion buffers 20*a* and 20*b*. In the DCA circuit 1 according to the first embodiment, the inversion buffer 20*a* generates the clock signal CLKT_IO, and the inversion buffer 20*b* generates the clock signal CLKB_IO. The clock signals CLKT_IO and CLKB_IO are designed to form a differential clock signal pair. Accordingly, a conversion circuit that is different from the DCA circuit 1 and is designed to convert a single-phase clock signal into a differential clock signal pair can be omitted. Thus, causes of duty error generation can be reduced, and the duty error can be made smaller.

Furthermore, in the DCA circuit 1 according to the first embodiment, the pulse generators 10*a* and 10*b* have substantially the same configurations. The inversion buffers 20*a* and 20*b* have substantially the same configurations. Meanwhile, the configuration for generating the pulse signals POT and NOT to control the inversion buffer 20*a*, and the configuration for generating the pulse signals POB and NOB to control the inversion buffer 20*b* are symmetrical to each other. Accordingly, it can be said that the configurations for generating the clock signals CLKT_IO and CLKB_IO to be output are also symmetrical to each other. Specifically, an inverter or the like for inverting the logic of only the input clock signal CLKIN_B is not included, for example. Thus, the duty error to be caused by the difference in the configuration for outputting the clock signal can be reduced.

Further, in the DCA circuit 1 according to the first embodiment, the back-to-back inverters 30 are provided at the output nodes of the two inversion buffers 20*a* and 20*b* that generate differential signals. With this arrangement, the voltage transition speeds at the respective inversion buffers 20*a* and 20*b* are made equal to each other, so that the difference between the time required to drive a P-type transistor and the time required to drive an N-type transistor can be averaged. Thus, it is possible to reduce the duty error to be caused by a difference between the time required to drive a P-type transistor and the time required to drive an N-type transistor.

With the above arrangement, the DCA circuit 1 according to the first embodiment can generate a differential clock signal pair having a small duty error. Because of this, it is possible to reduce the amount of correction of the duty cycle in the entire DCC circuit 400, and it is possible to reduce the duty variation due to the voltage and temperature variation accompanying the delay generated at the time of duty correction. Furthermore, as the current required for duty correction can also be reduced, an increase in power consumption in the DCC circuit 400 and an increase in installation area can be prevented. In addition to that, the frequency of execution of duty correction can be reduced, and thus, the performance of the entire memory system 100 can be enhanced.

2. Second Embodiment

Next, a second embodiment is described. In the description below, components similar to those of the first embodiment will not be explained, and components different from those of the first embodiment will be mainly explained.

2.1 Configuration of a Clock Adjustment Circuit

Figure 8:
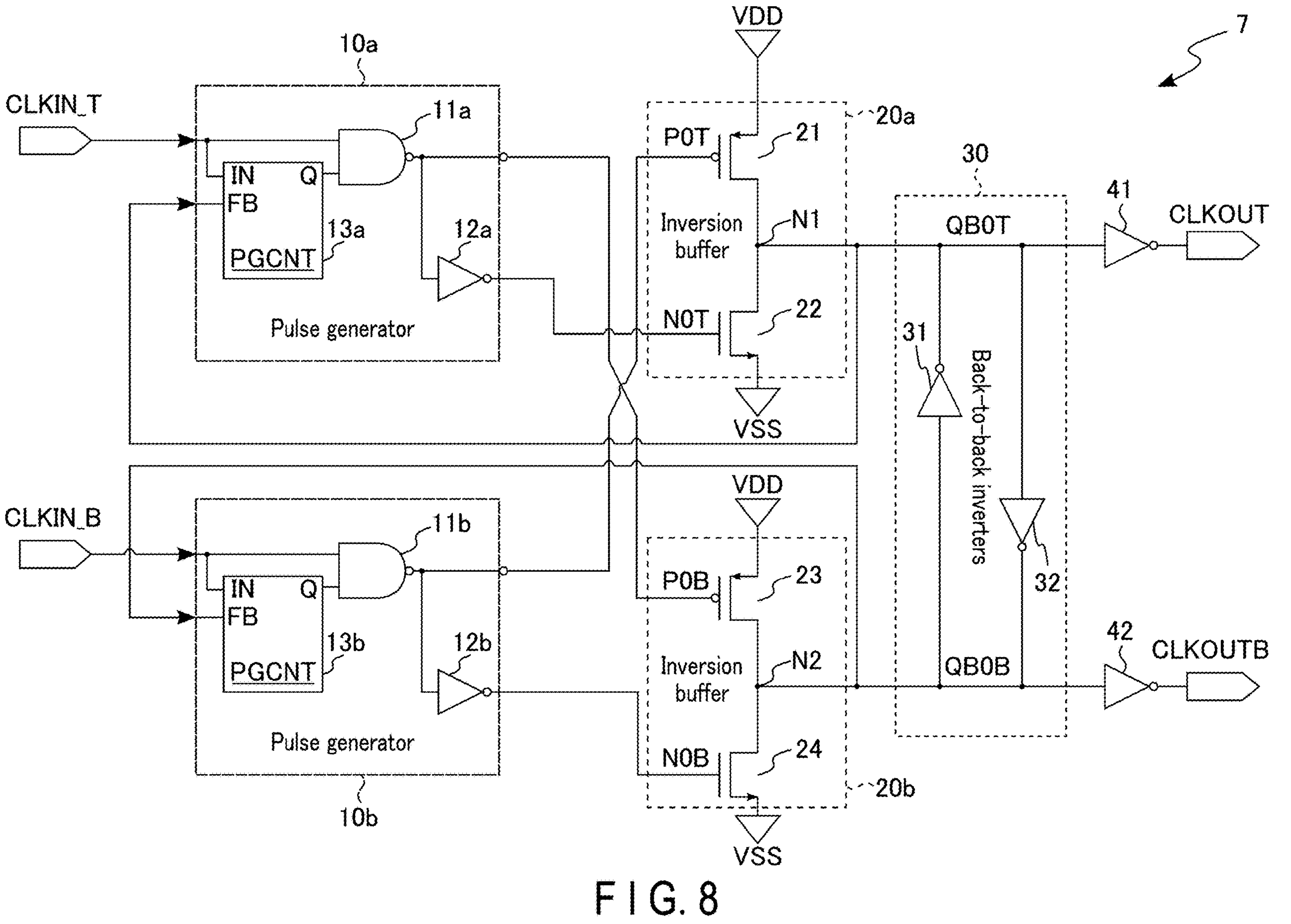
FIG. 8 is a circuit diagram illustrating an example circuit configuration of a clock adjustment circuit according to a second embodiment.
Figures 9, 10:
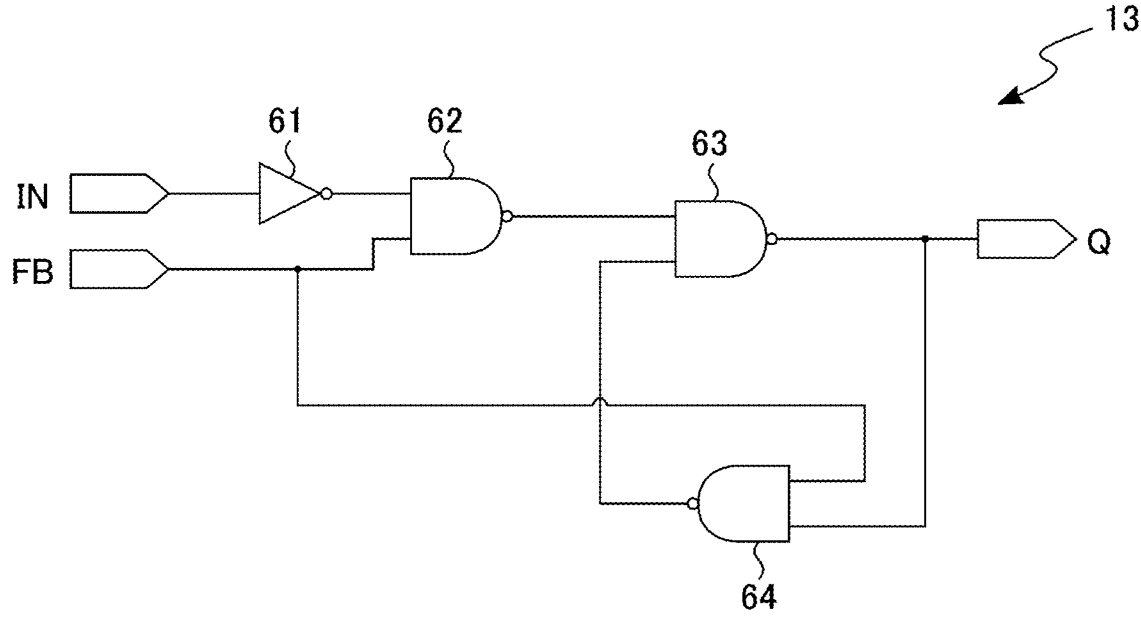
FIG. 9 is a truth table of pulse control circuits included in the clock adjustment circuit according to the second embodiment.
FIG. 10 is a circuit diagram illustrating an example circuit configuration of a pulse control circuit included in the clock adjustment circuit according to the second embodiment.

FIG. 8 is a circuit diagram illustrating an example configuration of a clock adjustment circuit according to the second embodiment. In a clock adjustment circuit 7 according to the second embodiment, pulse generators 10*a* and 10*b* further include pulse control circuits (PGCNT) 13*a* and 13*b*, respectively. FIG. 9 is a truth table of the pulse control circuits included in the clock adjustment circuit according to the second embodiment.

The pulse control circuits 13*a* and 13*b* are circuits that receive two inputs IN and FB, and return one output Q. The pulse control circuits 13*a* and 13*b* have a first input terminal for the input IN, a second input terminal for the input FB, and an output terminal for the output Q. The pulse control circuits 13*a* and 13*b* have substantially the same configurations. Hereinafter, in a case where the pulse control circuits 13*a* and 13*b* are not distinguished from each other, they will be referred to as the pulse control circuits 13.

The clock signal CLKIN_T is input to the first input terminal of the pulse control circuit 13*a*. The signal QB0T is input as a feedback signal to the second input terminal. The output terminal is coupled to the second input terminal of the NAND circuit 11*a*.

The clock signal CLKIN_B is input to the first input terminal of the pulse control circuit 13*b*. The signal QB0B is input as a feedback signal to the second input terminal. The output terminal is coupled to the second input terminal of the NAND circuit 11*b*.

The pulse control circuits 13 return outputs corresponding to the inputs, according to the truth table shown in FIG. 9. Specifically, when the logic level of the input IN is "0", and the logic level of the input FB is "0", the output Q at the logic level "0" is returned. When the logic level of the input IN is "0", and the logic level of the input FB is "1", the output Q at the logic level "1" is returned. When the logic level of the input IN is "1", and the logic level of the input FB is "0", the output Q at the logic level "O" is returned. When the logic level of the input IN is "1", and the logic level of the input FB is "1", the output Q returns a value holding the logic level (state) indicated by the output Q immediately before that.

FIG. 10 is a circuit diagram illustrating an example circuit configuration of a pulse control circuit included in the clock adjustment circuit according to the second embodiment. A pulse control circuit 13 includes an inverter 61, and NAND circuits 62, 63, and 64.

The inverter 61 is a logic circuit that performs a NOT-operation. The inverter 61 has an input terminal and an output terminal. The NAND circuits 62, 63, and 64 are logic circuits that perform NAND-operations. The NAND circuits 62, 63, and 64 each have a first input terminal, a second input terminal, and an output terminal.

The input IN is input to the input terminal of the inverter 61. The output terminal of the inverter 61 is coupled to the first input terminal of the NAND circuit 62. The input FB is input to the second input terminal of the NAND circuit 62 and the second input terminal of the NAND circuit 64. The output terminal of the NAND circuit 62 is coupled to the first input terminal of the NAND circuit 63. The output of the NAND circuit 64 is coupled to the second input terminal of the NAND circuit 63. The output terminal of the NAND circuit 63 outputs the output Q. The output Q is input as a feedback to the first input terminal of the NAND circuit 64.

With the circuit configuration as described above, a logic circuit that performs logical operations as shown in the truth table in FIG. 9 can be formed. Note that the above circuit configuration is an example, and any configuration as a logic circuit that performs logical operations as shown in the truth table in FIG. 9 may be adopted.

2.2 Effects

A DCA circuit 1 according to the second embodiment can reduce the duty error of clock signals to be output, as in the first embodiment.

Also, the DCA circuit 1 according to the second embodiment can reduce oscillation of the clock signals CLKT_IO and CLKB_IO to be output. This effect is now described in detail.

For example, a case where the clock signal CLKIN_T indicates the logic level "0", and the clock signal CLKIN_B indicates the logic level "1" is now discussed. At this point of time, the signal QB0B indicates the logic level "0". Since the input IN of the pulse control circuit 13*b* is "1", and the input FB is "0", the output Q indicates the logic level "0".

Here, in a case where the clock signal CLKIN_T rises and indicates the logic level "1", the transistor 23 is driven, and the signal QB0B rises. Since the input IN of the pulse control circuit 13*b* is "1", and the input FB is "1" at this point of time, the output Q indicates the logic level "0", which is the last logic level. Therefore, the transistors 21 and 24 are not driven. That is, oscillation of the clock signals CLKOUT and CLKOUTB can be reduced.

Likewise, in a case where the clock signal CLKIN_B rises when the clock signal CLKIN_T indicates the logic level "1", oscillation of the clock signals CLKOUT and CLKOUTB can also be reduced.

3. Third Embodiment

Next, a third embodiment is described. In the description below, components similar to those of the first embodiment will not be explained, and components different from those of the first embodiment will be mainly explained.

3.1 Clock Adjustment Circuit 3.1.1 Configuration

Figure 11:
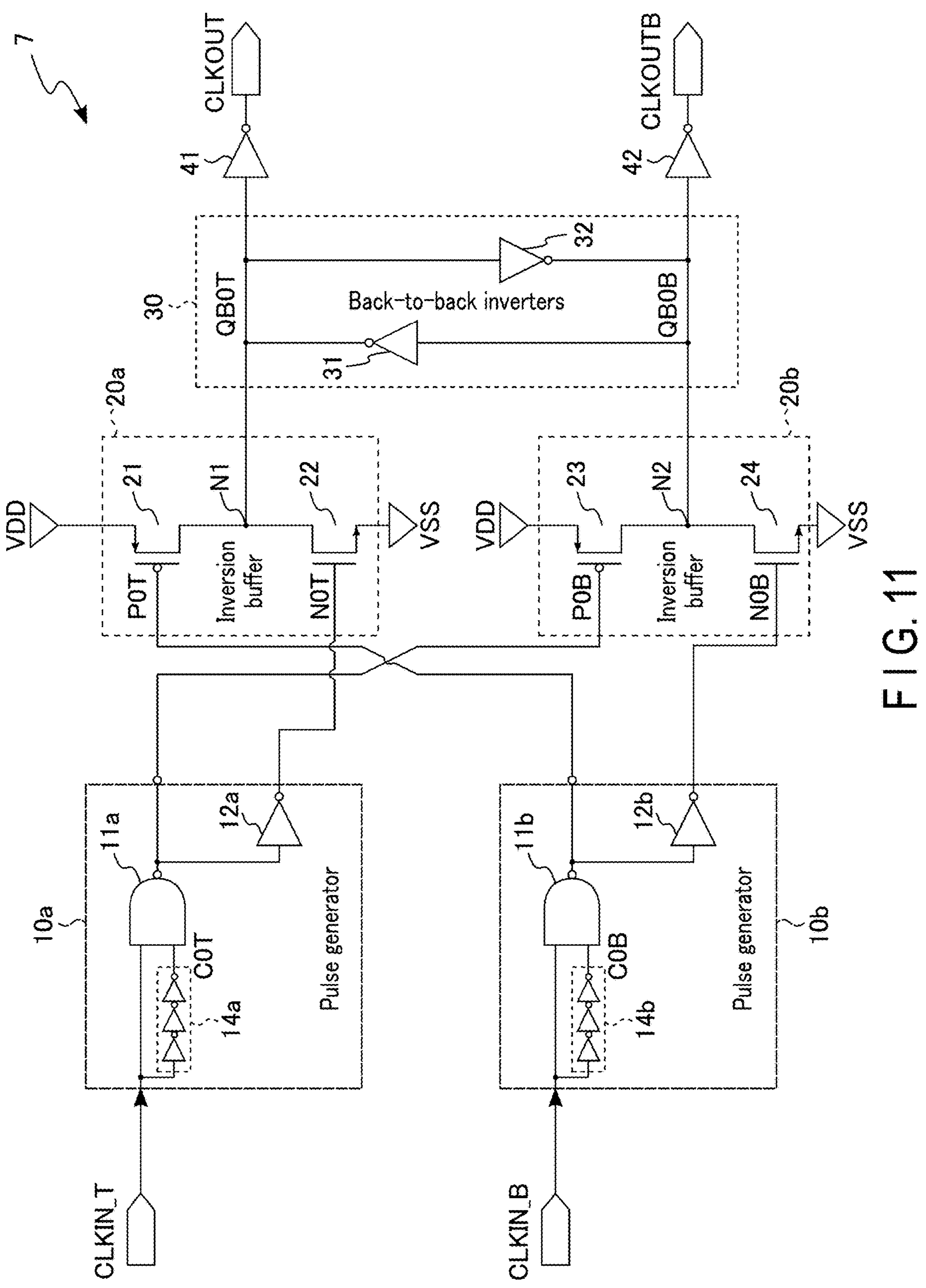
FIG. 11 is a circuit diagram illustrating an example circuit configuration of a clock adjustment circuit according to a third embodiment.

FIG. 11 is a circuit diagram illustrating an example configuration of a clock adjustment circuit according to the third embodiment. In a clock adjustment circuit 7 according to the third embodiment, pulse generators 10*a* and 10*b* further include delay circuits 14*a* and 14*b*, respectively.

The delay circuits 14*a* and 14*b* delay and output input signals. The delay circuits 14*a* and 14*b* each include an odd number of stages of series-coupled inverters. Note that, in FIG. 11, the delay circuits 14*a* and 14*b* each have a configuration in which three inverters are coupled in series, but are not limited to this configuration as long as the delay time condition described later is satisfied. For example, a configuration in which an odd number, which is five or greater, stages of inverters are coupled in series may be included. The delay circuits 14*a* and 14*b* have substantially the same configurations.

The clock signal CLKIN_T is input to the input terminal of the delay circuit 14*a*. The output terminal of the delay circuit 14*a* is coupled to the second input terminal of the NAND circuit 11*a*, and outputs a signal COT. The signal COT is a clock signal obtained by delaying the clock signal CLKIN_T.

The clock signal CLKIN_B is input to the input terminal of the delay circuit 14*b*. The output terminal of the delay circuit 14*b* is coupled to the second input terminal of the NAND circuit 11*b*, and outputs a signal COB. The signal COB is a clock signal obtained by delaying the clock signal CLKIN_B.

The clock adjustment circuit 7 according to the third embodiment does not include any feedback from the node N1 or N2 to the pulse generator 10*a* or 10*b*. Therefore, the pulse generators 10*a* and 10*b* generate pulse signals, regardless of any output result from the inversion buffer 20*a* or 20*b*.

3.1.2 Operation

FIG. 12 is a timing chart illustrating an example operation of the clock adjustment circuit according to the third embodiment. In the description below, an operation of the clock adjustment circuit 7 is explained with reference to FIG. 12.

The operation from when the clock signal CLKIN_T rises at time t1 to when the clock signal CLKOUT rises and the clock signal CLKOUTB falls at time t3 is similar to that in the first embodiment.

At time t4, the signal COT falls, in response to the delay by the delay circuit 14*a*. As a result, after the delay by the NAND circuit 11*a*, the pulse signal NOT falls, and the pulse signal POB rises at time t5.

The operation from when the clock signal CLKIN_B rises at time t6 to when the clock signal CLKOUT falls and the clock signal CLKOUTB rises at time t8 is similar to that in the first embodiment.

At time t9, the signal COB falls, in response to the delay by the delay circuit 14*b*. As a result, after the delay by the NAND circuit 11*b*, the pulse signal NOB falls, and the pulse signal POT rises at time t10. After that, the clock signal CLKIN_T rises at time t11, and thereafter, the above operation is repeated.

The delay time by the delay circuits 14*a* and 14*b* is set to be longer than the response time of the output signals in response to the input signals in the inverters 31 and 32 included in the back-to-back inverters 30, and to be shorter than the positive pulse widths of the clock signals CLKOUT and CLKOUTB to be output. Specifically, the delay circuit 14*a* delays the signal by a period that is longer than the period from time t1 at which the clock signal CLKIN_T rises to time t3 at which the back-to-back inverters 30 invert the signal (time t1 to time t3), and is shorter than the period till time t6 at which the clock signal CLKIN_B rises (time t1 to time t6). The delay circuit 14*b* delays the signal by a period that is longer than the period from time t6 at which the clock signal CLKIN_B rises to time t8 at which the back-to-back inverters 30 invert the signal (time t6 to time t8), and is shorter than the period till time t11 at which the clock signal CLKIN_T rises (time t6 to time t11).

3.2 Effects

A DCA circuit 1 according to the third embodiment can reduce the duty error of clock signals to be output, as in the first embodiment.

In addition to that, the DCA circuit 1 according to the third embodiment does not perform any feedback from an output of the inversion buffer 20*a* or 20*b* to the pulse generators 10*a* and 10*b*. Therefore, compared with the second embodiment, a logic circuit that generates a signal based on a feedback signal is not necessary, and thus, generation of parasitic capacitance in the DCA circuit 1 can be reduced. Furthermore, oscillation of the clock signals CLKT_IO and CLKB_IO to be output can be reduced.

4. Fourth Embodiment

Next, a fourth embodiment is described. The fourth embodiment is an embodiment derived from the third embodiment. In the description below, components similar to those of the first embodiment and the third embodiment will not be explained, and components different from those of the first embodiment and the third embodiment will be mainly explained.

4.1 Configuration of a DCA Circuit

The configuration of a DCA circuit according to the fourth embodiment is now described. FIG. 13 is a block diagram illustrating an example configuration of the DCA circuit according to the fourth embodiment. As illustrated in FIG. 13, a DCA circuit 1 receives an input of a set signal SETB and a reset signal RSTB.

The set signal SETB and the reset signal RSTB are signals that are transmitted from an external control circuit (not shown), for example. The set signal SETB and the reset signal RSTB are input to the clock adjustment circuit 7.

4.2 Clock Adjustment Circuit 4.2.1 Configuration

Figure 14:
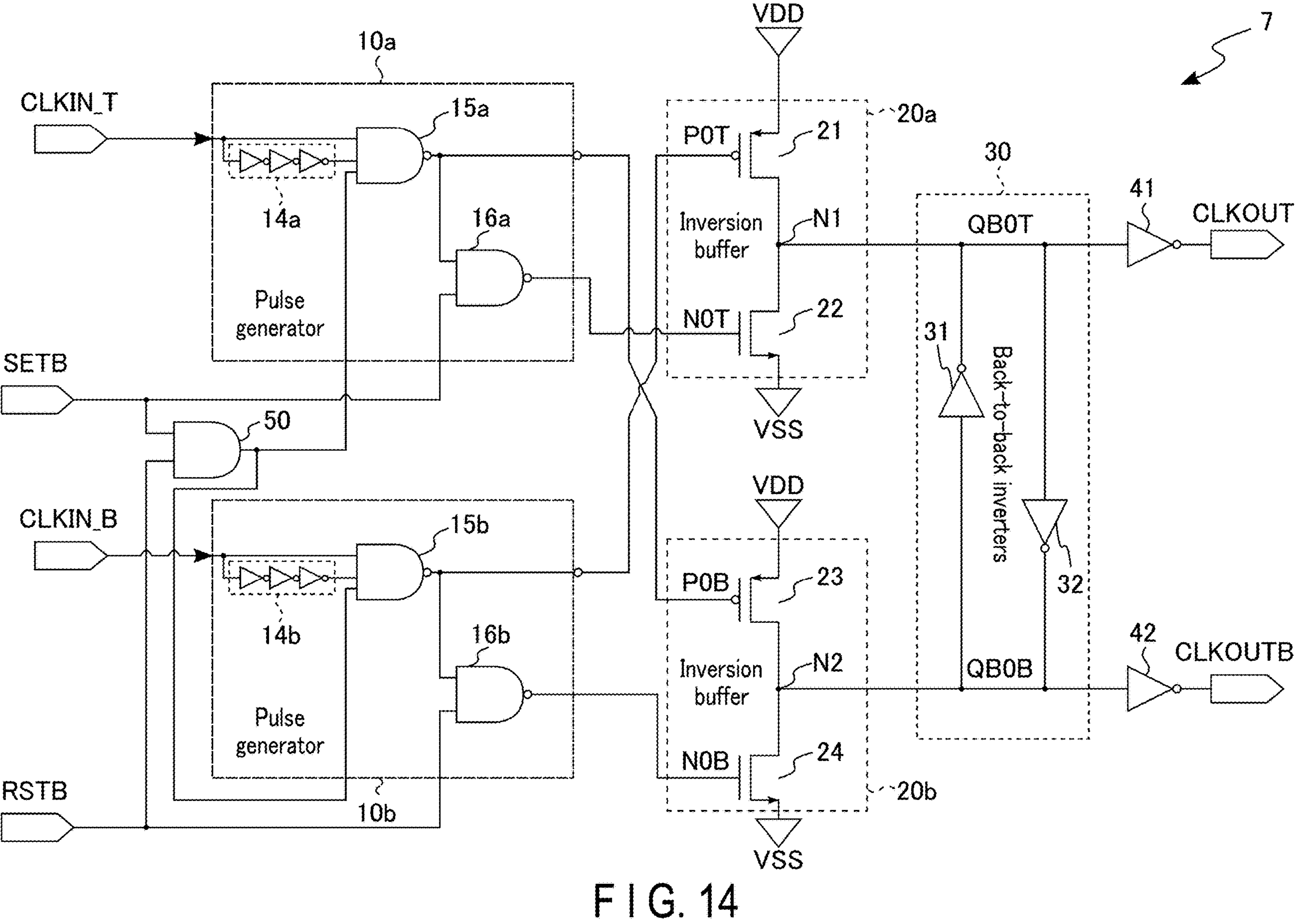
FIG. 14 is a circuit diagram illustrating an example circuit configuration of a clock adjustment circuit according to the fourth embodiment.

FIG. 14 is a circuit diagram illustrating an example configuration of the clock adjustment circuit according to the fourth embodiment. The clock adjustment circuit 7 according to the fourth embodiment further includes an AND circuit 50. Further, the pulse generators 10*a* and 10*b* include NAND circuits 15*a* and 15*b*, respectively, instead of the NAND circuits 11*a* and 11*b*. The pulse generators 10*a* and 10*b* include NAND circuits 16*a* and 16*b*, respectively, instead of the inverters 12*a* and 12*b*.

The NAND circuits 15*a* and 15*b* are logic circuits that perform NAND-operations. The NAND circuits 15*a* and 15*b* each have first, second and third input terminals and an output terminal.

The clock signal CLKIN_T is input to the first input terminal of the NAND circuit 15*a*. The signal COT, which is an output of the delay circuit 14*a*, is input to the second input terminal. An output signal of an AND circuit 50 described later is input to the third input terminal. The output terminal of the NAND circuit 15*a* is coupled to the gate terminal of the transistor 23, and outputs the pulse signal POB.

The clock signal CLKIN_B is input to the first input terminal of the NAND circuit 15*b*. The signal COB, which is an output of the delay circuit 14*b*, is input to the second input terminal. An output signal of an AND circuit 50 described later is input to the third input terminal. The output terminal of the NAND circuit 15*b* is coupled to the gate terminal of the transistor 21, and outputs the pulse signal POT.

The NAND circuits 16*a* and 16*b* are logic circuits that perform NAND-operations. The NAND circuits 16*a* and 16*b* each have first and second input terminals and an output terminal.

The pulse signal POB is input to the first input terminal of the NAND circuit 16*a*. The set signal SETB is input to the second input terminal. The output terminal of the NAND circuit 16*a* is coupled to the gate terminal of the transistor 22, and outputs the pulse signal NOT.

The pulse signal POT is input to the first input terminal of the NAND circuit 16*b*. The reset signal RSTB is input to the second input terminal. The output terminal of the NAND circuit 16*b* is coupled to the gate terminal of the transistor 24, and outputs the pulse signal NOB.

The AND circuit 50 is a logic circuit that performs an AND-operation. The AND circuit 50 has first and second input terminals and an output terminal.

The set signal SETB is input to the first input terminal of the AND circuit 50. The reset signal RSTB is input to the second input terminal. The output terminal of the AND circuit 50 is coupled to the third input terminal of the NAND circuit 15*a* and the third input terminal of the NAND circuit 15*b*.

4.2.2 Operation

Figure 16:
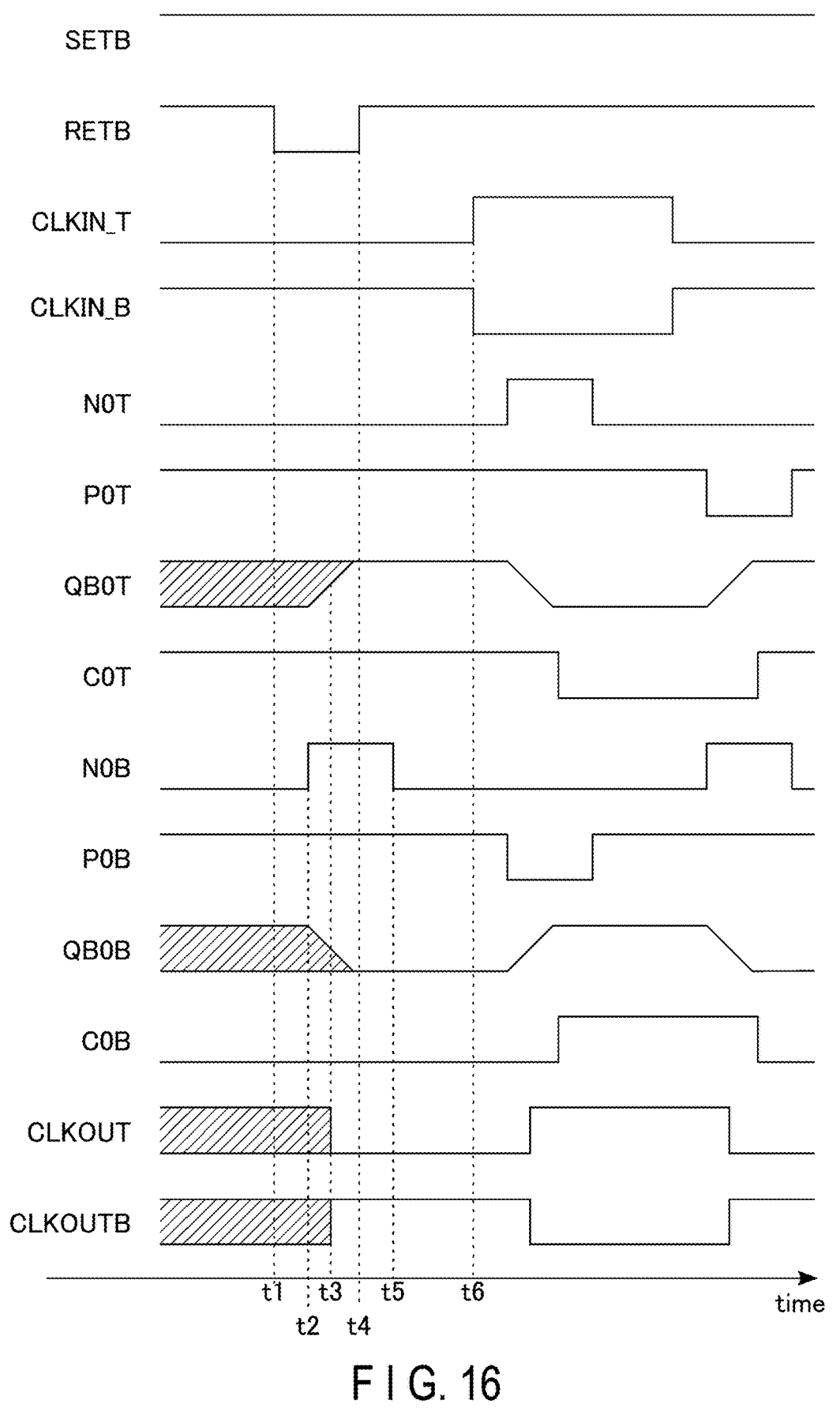

FIGS. 15 and 16 are timing charts illustrating an example operation of the clock adjustment circuit according to the fourth embodiment. In FIGS. 15 and 16, the hatched portions indicate an unstable state in which the logic level is uncertain, and the signal has any voltage included in the hatched regions. In the description below, an operation of the clock adjustment circuit 7 is explained with reference to FIGS. 15 and 16.

Immediately after the power supply to the DCA circuit 1 is turned on or the like, the inversion buffers 20*a* and 20*b* are not driven until either CLKIN_T or CLKIN_B to be input to the clock adjustment circuit 7 rises. Therefore, as shown in FIGS. 15 and 16, the clock signals CLKOUT and CLKOUTB to be output are in an unstable state. Even if the inversion buffers 20*a* and 20*b* are driven in this state, the initial states of the clock signals CLKOUT and CLKOUTB are unstable, it might time until the outputs are stabilized.

As a means to solve this problem, it is conceivable to fix the initial states of the clock signals CLKOUT and CLKOUTB. The operation of fixing the clock signal CLKOUT to the logic level "1" is referred to as the "set operation", and the operation of fixing the clock signal CLKOUT to the logic level "0" is referred to as the "reset operation". As the set operation or the reset operation is performed, the initial states of the clock signals CLKOUT and CLKOUTB can be fixed, and it is possible to operate the clock adjustment circuit 7 while avoiding an unstable state.

The set signal SETB and the reset signal RSTB are signals indicating the logic level "1" in a normal state (when neither the set operation nor the reset operation is performed). When the set operation is performed, the set signal SETB temporarily indicates the logic level "0", and then returns to the logic level "1". When the reset operation is performed, the reset signal RSTB temporarily indicates the logic level "0", and then returns to the logic level "1".

The operation illustrated in FIG. 15 corresponds to the set operation. When the set operation is performed, the set signal SETB falls at time t1. At this point of time, the output of the NAND circuit 16*a* is "1", and therefore, the pulse signal NOT rises at time t2 after a delay by the NAND circuit 16*a*. As a result, the transistor 22 is driven, and the voltage of the node N1 gradually falls. Accordingly, the signal QB0T gradually falls. Further, the signal QB0B gradually rises, because of an effect of the inverter 32.

When the voltage of the signal QB0T reaches the threshold voltage of the inverter 41 at time t3, the logic level of the clock signal CLKOUT is fixed at "1". Also, when the voltage of the signal QB0B reaches the threshold voltage of the inverter 42, the logic level of the clock signal CLKOUTB is fixed at "0".

After that, when the set signal SETB rises at time t4, the pulse signal NOT falls at time t5 after a delay by the NAND circuit 16*a*.

After all of these processes are completed, the clock signal CLKIN_B to be input at time t6 rises. The input of the clock signal after the set operation is performed starts from the rise of the clock signal CLKIN_B. Thereafter, the same operation as that in the third embodiment is performed.

The operation illustrated in FIG. 16 corresponds to the reset operation. When the reset operation is performed, the reset signal RSTB falls at time t1. At this point of time, the output of the NAND circuit 16*b* is "1", and therefore, the pulse signal NOB rises at time t2 after a delay by the NAND circuit 16*b*. As a result, the transistor 24 is driven, and the voltage of the node N2 gradually falls. Accordingly, the signal QB0B gradually falls. Further, the signal QB0T gradually rises, because of an effect of the inverter 31.

When the voltage of the signal QB0T reaches the threshold voltage of the inverter 41 at time t3, the logic level of the clock signal CLKOUT is fixed at "0". Also, when the voltage of the signal QB0B reaches the threshold voltage of the inverter 42, the logic level of the clock signal CLKOUTB is fixed at "1".

After that, when the reset signal RSTB rises at time t4, the pulse signal NOB falls at time t5 after a delay by the NAND circuit 16*b*.

After all of these processes are completed, the clock signal CLKIN_T to be input at time t6 rises. The input of the clock signal after the reset operation is performed starts from the rise of the clock signal CLKIN_T. Thereafter, the same operation as that in the third embodiment is performed.

4.3 Effects

A DCA circuit 1 according to the fourth embodiment can reduce the duty error of clock signals to be output, as in the first embodiment. Also, the DCA circuit 1 according to the fourth embodiment can reduce oscillation of the clock signals CLKT_IO and CLKB_IO to be output, as in the third embodiment.

In addition to that, the DCA circuit 1 according to the fourth embodiment can avoid unstable states of the clock signals CLKT_IO and CLKB_IO, which are output signals, immediately after the power supply is turned on or the like. Because of this, stable clock signals CLKT_IO and CLKB_IO can be output immediately after the power supply is turned on.

4.4 Modifications

In the fourth embodiment, the circuit for performing the set operation and the reset operation is added to the configuration including the delay circuits 14*a* and 14*b* in the respective pulse generators 10$a$ and 10$b$ described in the third embodiment. However, the present embodiment is not limited to this. For example, the circuit for performing the set operation and the reset operation may be added to the configuration described in the first embodiment. For example, the circuit for performing the set operation and the reset operation may be added to the configuration including the pulse control circuits 13$a$ and 13$b$ in the respective pulse generators 10$a$ and 10$b$ described in the second embodiment. The following is a description of the differences between the fourth embodiment and a first modification of the fourth embodiment in which the circuit for performing the set operation and the reset operation is added to the configuration including the pulse control circuits 13$a$ and 13$b$ in the respective pulse generators 10$a$ and 10$b$.

Figure 17:
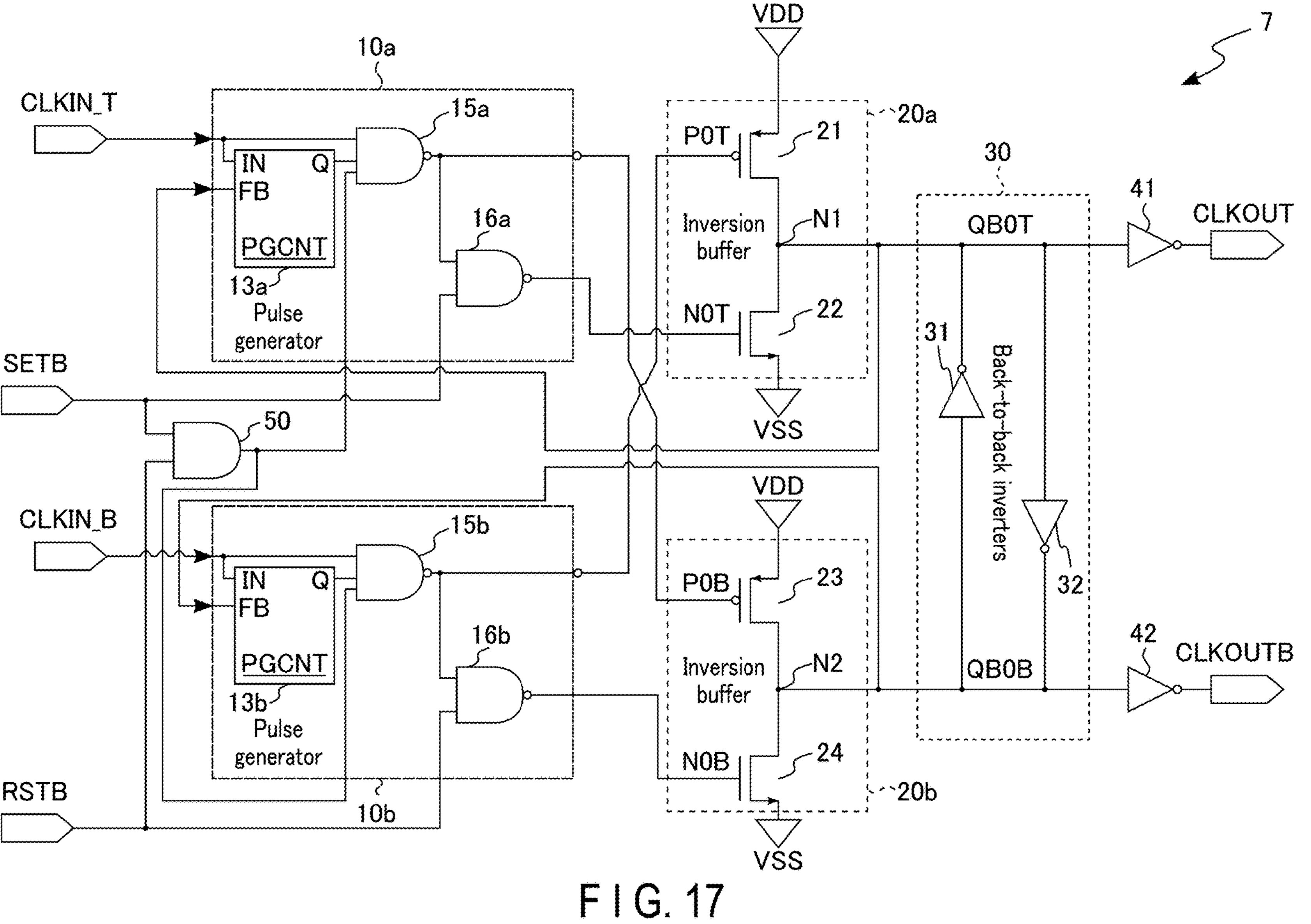
FIG. 17 is a circuit diagram illustrating an example circuit configuration of a clock adjustment circuit according to a first modification of the fourth embodiment.

FIG. 17 is a circuit diagram illustrating an example circuit configuration of a clock adjustment circuit according to the first modification of the fourth embodiment. As shown in FIG. 17, a clock adjustment circuit 7 according to the first modification of the fourth embodiment includes pulse control circuits 13$a$ and 13$b$ in place of the delay circuits 14$a$ and 14$b$ in the pulse generators 10$a$ and 10$b$, respectively.

The pulse control circuits 13$a$ and 13$b$ are circuits that receive two inputs IN and FB, and return one output Q. The pulse control circuits 13$a$ and 13$b$ have a first input terminal for the input IN, a second input terminal for the input FB, and an output terminal for the output Q. The pulse control circuits 13$a$ and 13$b$ return outputs corresponding to the inputs, according to the same truth table as the truth table shown in FIG. 9.

The clock signal CLKIN_T is input to the first input terminal of the pulse control circuit 13$a$. The signal QB0T is input as a feedback signal to the second input terminal. The output terminal is coupled to the second input terminal of the NAND circuit 15$a$.

The clock signal CLKIN_B is input to the first input terminal of the pulse control circuit 13$b$. The signal QB0B is input as a feedback signal to the second input terminal. The output terminal is coupled to the second input terminal of the NAND circuit 15$b$.

A DCA circuit 1 according to the first modification of the fourth embodiment can avoid unstable states of the clock signals CLKT_IO and CLKB_IO, which are output signals, immediately after the power supply is turned on or the like, as in the fourth embodiment. Because of this, stable clock signals CLKT_IO and CLKB_IO can be output immediately after the power supply is turned on.

5. Others

In the first to fourth embodiments described above, examples in which the memory controller 200 is coupled to each memory chip 320 via the interface chip 310 have been described. However, the present invention is not limited to this configuration. For example, the memory controller 200 may be coupled to each memory chip 320 not via the interface chip 310. In that case, the DCC circuit 400 is included in each memory chip 320, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:

a first pulse generator that generates a first pulse signal based on a first signal, and a second pulse signal that is an inverted signal of the first pulse signal;

a second pulse generator that generates a third pulse signal based on a second signal, and a fourth pulse signal that is an inverted signal of the third pulse signal;

a first inversion buffer that outputs a third signal from a first node, based on inputs of the first pulse signal and the third pulse signal; and a second inversion buffer that outputs a fourth signal from a second node, based on inputs of the second pulse signal and the fourth pulse signal, wherein, when a logic level of the first pulse signal changes from a first logic level to a second logic level different from the first logic level, the first inversion buffer changes a logic level of the third signal from the second logic level to the first logic level, and, when a logic level of the third pulse signal changes from the second logic level to the first logic level, the first inversion buffer changes the logic level of the third signal from the first logic level to the second logic level, and, when a logic level of the second pulse signal changes from the second logic level to the first logic level, the second inversion buffer changes a logic level of the fourth signal from the first logic level to the second logic level, and, when a logic level of the fourth pulse signal changes from the first logic level to the second logic level, the second inversion buffer changes the logic level of the fourth signal from the second logic level to the first logic level.

2. The semiconductor integrated circuit according to claim 1, further comprising:

a first inverter including an input terminal coupled to the first node, and an output terminal coupled to the second node; and a second inverter including an input terminal coupled to the second node, and an output terminal coupled to the first node.

3. The semiconductor integrated circuit according to claim 1, further comprising:

a third inverter including an input terminal coupled to the first node; and a fourth inverter including an input terminal coupled to the second node.

4. The semiconductor integrated circuit according to claim 1, wherein when a logic level of the first signal changes from the first logic level to the second logic level, the first pulse generator changes the logic level of the first pulse signal from the first logic level to the second logic level, and changes the logic level of the second pulse signal from the second logic level to the first logic level, and, when a logic level of the second signal changes from the first logic level to the second logic level, the second pulse generator changes the logic level of the third pulse signal from the second logic level to the first logic level, and changes the logic level of the fourth pulse signal from the first logic level to the second logic level.

5. The semiconductor integrated circuit according to claim 4, wherein the first pulse generator includes: a first NAND circuit including a first input terminal to which the first signal is input, a second input terminal to which the third signal is input, and an output terminal from which the second pulse signal is output and a fifth inverter to which the second pulse signal is input, and from which the first pulse signal is output, and the second pulse generator includes: a second NAND circuit including a third input terminal to which the second signal is input, a fourth input terminal to which the fourth signal is input, and an output terminal from which the third pulse signal is output and a sixth inverter to which the third pulse signal is input, and from which the fourth pulse signal is output.

6. The semiconductor integrated circuit according to claim 1, wherein the first inversion buffer includes a first transistor and a second transistor that are coupled via the first node, the third pulse signal being input to a gate terminal of the first transistor, the first pulse signal being input to a gate terminal of the second transistor, the third signal being output from an output terminal of the first inversion buffer coupled to the first node, the second inversion buffer includes a third transistor and a fourth transistor that are coupled via the second node, the second pulse signal being input to a gate terminal of the third transistor, the fourth pulse signal being input to a gate terminal of the fourth transistor, and the fourth signal being output from an output terminal of the second inversion buffer coupled to the second node.

7. The semiconductor integrated circuit according to claim 6, wherein the first transistor, the second transistor, the third transistor, and the fourth transistor are MOS transistors, the first transistor and the third transistor are of a first conductivity type, and the second transistor and the fourth transistor are of a second conductivity type different from the first conductivity type.

8. The semiconductor integrated circuit according to claim 2, wherein a magnitude of current to be output from the first inverter and the second inverter is smaller than a magnitude of current to be output from the first inversion buffer and the second inversion buffer.

9. The semiconductor integrated circuit according to claim 5, wherein the first pulse generator further includes a first pulse control circuit, the first pulse control circuit includes a fifth input terminal to which the first signal is input, a sixth input terminal to which the third signal is input, and a first output terminal, an output of the first pulse control circuit, instead of the third signal, is input to the second input terminal of the first NAND circuit, when a signal at the first logic level is input to both the fifth input terminal and the sixth input terminal, the first pulse control circuit outputs a signal at the first logic level from the first output terminal, when a signal at the first logic level is input to the fifth input terminal, and a signal at the second logic level is input to the sixth input terminal, the first pulse control circuit outputs a signal at the second logic level from the first output terminal, when a signal at the second logic level is input to the fifth input terminal, and a signal at the first logic level is input to the sixth input terminal, the first pulse control circuit outputs a signal at the first logic level from the first output terminal, when a signal at the second logic level is input to the fifth input terminal, and a signal at the first logic level is input to the sixth input terminal, and when a signal at the second logic level is input to both the fifth input terminal and the sixth input terminal, the first pulse control circuit outputs, from the first output terminal, a signal holding a logic level of a signal output from the first output terminal last time, the second pulse generator further includes a second pulse control circuit, the second pulse control circuit includes a seventh input terminal to which the second signal is input, an eighth input terminal to which the fourth signal is input, and a second output terminal, an output of the second pulse control circuit, instead of the fourth signal, is input to the fourth input terminal of the first NAND circuit, when a signal at the first logic level is input to both the seventh input terminal and the eighth input terminal, the second pulse control circuit outputs a signal at the first logic level from the second output terminal, when a signal at the first logic level is input to the seventh input terminal, and a signal at the second logic level is input to the eighth input terminal, the second pulse control circuit outputs a signal at the second logic level from the second output terminal, when a signal at the second logic level is input to the seventh input terminal, and a signal at the first logic level is input to the eighth input terminal, the second pulse control circuit outputs a signal at the first logic level from the second output terminal, and when a signal at the second logic level is input to both the seventh input terminal and the eighth input terminal the second pulse control circuit outputs, from the second output terminal, a signal holding a logic level of a signal output from the second output terminal last time.

10. The semiconductor integrated circuit according to claim 5, wherein the first pulse generator further includes a first delay circuit, the first delay circuit includes an input terminal to which the first signal is input, a first delay element, and an output terminal, an output of the first delay circuit, instead of the third signal, is input to the second input terminal of the first NAND circuit, the second pulse generator further includes a second delay circuit, the second delay circuit includes an input terminal to which the second signal is input, a second delay element, and an output terminal, and an output of the second delay circuit, instead of the fourth signal, is input to the fourth input terminal of the second NAND circuit.

11. The semiconductor integrated circuit according to claim 1, wherein a pulse width of the first pulse signal, the second pulse signal, the third pulse signal, and the fourth pulse signal is greater than a response time of an output signal in response to an input signal of the first inversion buffer and the second inversion buffer, and is smaller than a pulse width of the third signal and the fourth signal.

12. The semiconductor integrated circuit according to claim 10, further comprising:

a first inverter including an input terminal coupled to the first node, and an output terminal coupled to the second node; and a second inverter including an input terminal coupled to the second node, and an output terminal coupled to the first node, wherein a delay time of the first delay element and a delay time of the second delay element are longer than a response time of an output signal in response to an input signal of the first inverter and the second inverter, and are shorter than a pulse width of the third signal and the fourth signal.

13. The semiconductor integrated circuit according to claim 1, wherein the first pulse generator generates the first pulse signal and the second pulse signal, based on a fifth signal and a sixth signal, in addition to the first signal, the second pulse generator generates the third pulse signal and the fourth pulse signal, based on the fifth signal and the sixth signal, in addition the second signal, when a logic level of the fifth signal changes from the second logic level to the first logic level, the first pulse generator changes the logic level of the first pulse signal and the second pulse signal to the second logic level, and the second pulse generator changes the logic level of the third pulse signal to the second logic level, and changes the logic level of the fourth pulse signal to the first logic level, and, when a logic level of the sixth signal changes from the second logic level to the first logic level, the first pulse generator changes the logic level of the first pulse signal to the first logic level and changes the logic level of the second pulse signal to the second logic level, and the second pulse generator changes the logic level of the third pulse signal and the fourth pulse signal to the second logic level.

14. The semiconductor integrated circuit according to claim 13, further comprising an AND circuit including a ninth input terminal to which the fifth signal is input, a tenth input terminal to which the sixth signal is input, and a third output terminal, wherein the first pulse generator includes: a first NAND circuit including a first input terminal to which the first signal is input, a second input terminal to which the third signal is input, an eleventh input terminal coupled to the third output terminal of the AND circuit, and an output terminal from which the second pulse signal is output, and a third NAND circuit including a twelfth input terminal to which the second pulse signal is input, a thirteenth input terminal to which the fifth signal is input, and an output terminal from which the first pulse signal is output, and the second pulse generator includes: a second NAND circuit including a third input terminal to which the second signal is input, a fourth input terminal to which the fourth signal is input, a fourteenth input terminal coupled to the third output terminal of the AND circuit, and a fourth output terminal from which the third pulse signal is output, and a fourth NAND circuit including a fifteenth input terminal to which the third pulse signal is input, a sixteenth input terminal to which the sixth signal is input, and an output terminal from which the fourth pulse signal is output.

15. The semiconductor integrated circuit according to claim 14, wherein the first pulse generator further includes a first pulse control circuit, the first pulse control circuit includes a fifth input terminal to which the first signal is input, a sixth input terminal to which the third signal is input, and a first output terminal, an output of the first pulse control circuit, instead of the third signal, is input to the second input terminal of the first NAND circuit, when a signal at the first logic level is input to both the fifth input terminal and the sixth input terminal, the first pulse control circuit outputs a signal at the first logic level from the first output terminal, when a signal at the first logic level is input to the fifth input terminal, and a signal at the second logic level is input to the sixth input terminal, the first pulse control circuit outputs a signal at the second logic level from the first output terminal, when a signal at the second logic level is input to the fifth input terminal, and a signal at the first logic level is input to the sixth input terminal, the first pulse control circuit outputs a signal at the first logic level from the first output terminal, and when a signal at the second logic level is input to both the fifth input terminal and the sixth input terminal, the first pulse control circuit outputs, from the first output terminal, a signal holding a logic level of a signal output from the first output terminal last time, the second pulse generator further includes a second pulse control circuit, the second pulse control circuit includes a seventh input terminal to which the second signal is input, an eighth input terminal to which the fourth signal is input, and a second output terminal, an output of the second pulse control circuit, instead of the fourth signal, is input to the fourth input terminal of the first NAND circuit, when a signal at the first logic level is input to both the seventh input terminal and the eighth input terminal, the second pulse control circuit outputs a signal at the first logic level from the second output terminal, when a signal at the first logic level is input to the seventh input terminal, and a signal at the second logic level is input to the eighth input terminal, the second pulse control circuit outputs a signal at the second logic level from the second output terminal, when a signal at the second logic level is input to the seventh input terminal, and a signal at the first logic level is input to the eighth input terminal, the second pulse control circuit outputs a signal at the first logic level from the second output terminal, and when a signal at the second logic level is input to both the seventh input terminal and the eighth input terminal the second pulse control circuit outputs, from the second output terminal, a signal holding a logic level of a signal output from the second output terminal last time.

16. The semiconductor integrated circuit according to claim 14, wherein the first pulse generator further includes a first delay circuit, the first delay circuit includes an input terminal to which the first signal is input, a first delay element, and an output terminal, an output of the first delay circuit, instead of the third signal, is input to the second input terminal of the first NAND circuit, the second pulse generator further includes a second delay circuit, the second delay circuit includes an input terminal to which the second signal is input, a second delay element, and an output terminal, and an output of the second delay circuit, instead of the fourth signal, is input to the fourth input terminal of the second NAND circuit.

17. The semiconductor integrated circuit according to claim 1, further comprising:

a first delay adjustment circuit that adds a delay to a seventh signal, to output the first signal; and a second delay adjustment circuit that adds a delay to an eighth signal, to output the second signal.

18. The semiconductor integrated circuit according to claim 17, further comprising:

an input/output buffer that performs control including amplification on the third signal and the fourth signal;

a DCD circuit that measures pulse widths of the third signal and the fourth signal, and detects and outputs a magnitude of a difference in duty cycle between the third signal and the fourth signal; and a DCC logic circuit that receives an output of the DCD circuit, determines a delay setting value, and controls a delay time in the first delay adjustment circuit and the second delay adjustment circuit.

19. A memory system comprising:

a memory controller;

a memory chip including a memory cell array including a plurality of memory cells; and an interface chip that interfaces transmission and reception of a signal exchanged between the memory controller and the memory chip, wherein the interface chip includes the semiconductor integrated circuit according to claim 18 as a DCC circuit, and the DCC circuit adjusts a duty cycle of a signal transmitted and received between the memory controller and the memory chip.

20. A memory system comprising:

a memory controller; and a memory chip including a memory cell array including a plurality of memory cells, wherein the memory chip includes the semiconductor integrated circuit according to claim 18 as a DCC circuit, and the DCC circuit adjusts a duty cycle of a signal that is received from the memory controller or is transmitted to the memory controller.

* * * * *